(12) United States Patent
Zuniga et al.

(10) Patent No.: US 8,866,217 B2
(45) Date of Patent: Oct. 21, 2014

(54) VERTICAL GATE LDMOS DEVICE

(75) Inventors: Marco A. Zuniga, Palo Alto, CA (US); Yang Lu, Fremont, CA (US); Badredin Fatemizadeh, Sunnyvale, CA (US); Jayasimha Prasad, San Jose, CA (US); Amit Paul, Sunnyvale, CA (US); Jun Ruan, Santa Clara, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 0 days.

(21) Appl. No.: 13/572,015

(22) Filed: Aug. 10, 2012

(65) Prior Publication Data

US 2013/0105887 A1    May 2, 2013

Related U.S. Application Data

(60) Provisional application No. 61/522,429, filed on Aug. 11, 2011.

(51) Int. Cl.
*H01L 29/78*    (2006.01)
*H01L 29/66*    (2006.01)

(52) U.S. Cl.
CPC ...... *H01L 29/66704* (2013.01); *H01L 29/7802* (2013.01); *H01L 29/78* (2013.01); *H01L 29/7825* (2013.01); *H01L 29/7827* (2013.01)
USPC .... 257/330; 257/335; 257/343; 257/E29.257; 257/E29.258

(58) Field of Classification Search
USPC .......... 257/330, 335, 343, E29.257, E29.258
See application file for complete search history.

(56) References Cited

U.S. PATENT DOCUMENTS

| | | | |
|---|---|---|---|
| 5,434,435 A | 7/1995 | Baliga | |
| 5,723,891 A * | 3/1998 | Malhi | 257/341 |
| 5,818,084 A * | 10/1998 | Williams et al. | 257/329 |
| 6,870,222 B2 | 3/2005 | Kim et al. | |
| 6,876,035 B2 | 4/2005 | Abadeer et al. | |
| 7,033,891 B2 | 4/2006 | Wilson et al. | |
| 7,220,633 B2 | 5/2007 | You et al. | |
| 7,576,388 B1 | 8/2009 | Wilson et al. | |
| 7,868,378 B1 | 1/2011 | Zuniga et al. | |
| 8,198,677 B2 | 6/2012 | Wilson et al. | |
| 2004/0065919 A1 | 4/2004 | Wilson et al. | |

(Continued)

FOREIGN PATENT DOCUMENTS

JP    2005136150 A    5/2005

OTHER PUBLICATIONS

International Search Report and Written Opinion issued for International Application No. PCT/US2012/050199 dated Mar. 4, 2013; 14 pages.

*Primary Examiner* — Victor A Mandala
(74) *Attorney, Agent, or Firm* — Lathrop & Gage LLP

(57) ABSTRACT

Described here are transistors and fabrication methods thereof. In one implementation, a transistor includes an n-well region implanted into a surface of a substrate, and a trench in the n-well region. The trench extends from the surface to a first depth. The trench includes a gate of conductive material in the trench, and dielectric material filling a volume of the trench not filled by the conductive material. The transistor also includes a p-type material in a first region extending from a second depth to a third depth, the second depth and the third depth being greater than the first depth. The transistor further includes a source region and a drain region.

16 Claims, 35 Drawing Sheets

(56) References Cited

U.S. PATENT DOCUMENTS

| | | |
|---|---|---|
| 2009/0166736 A1 | 7/2009 | Park |
| 2009/0256212 A1 | 10/2009 | Denison et al. |
| 2009/0273026 A1 | 11/2009 | Wilson et al. |
| 2011/0151634 A1* | 6/2011 | Denison et al. ............... 438/270 |
| 2012/0248528 A1 | 10/2012 | Wilson et al. |
| 2013/0105888 A1* | 5/2013 | Zuniga et al. ................. 257/330 |
| 2013/0109143 A1* | 5/2013 | Zuniga et al. ................. 438/270 |
| 2013/0115744 A1* | 5/2013 | Zuniga et al. ................. 438/270 |

\* cited by examiner

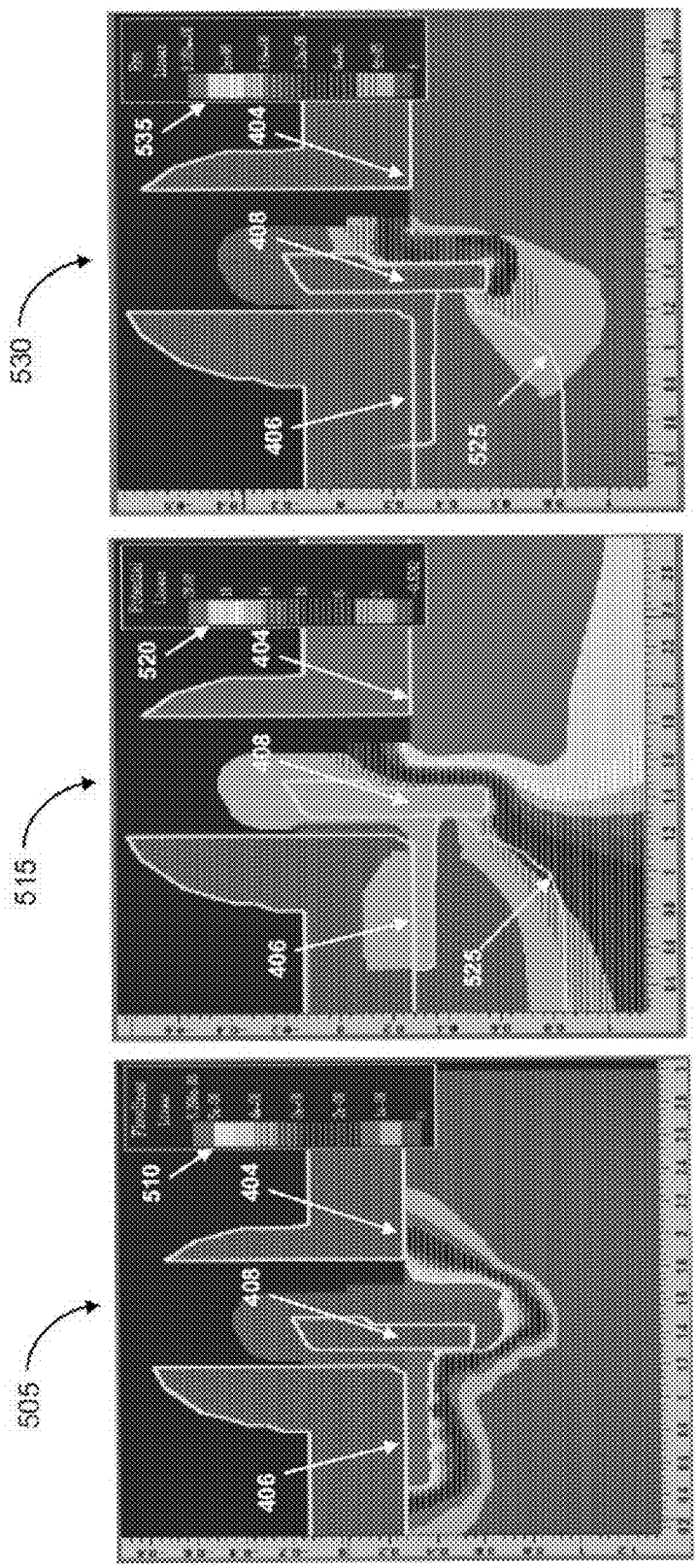

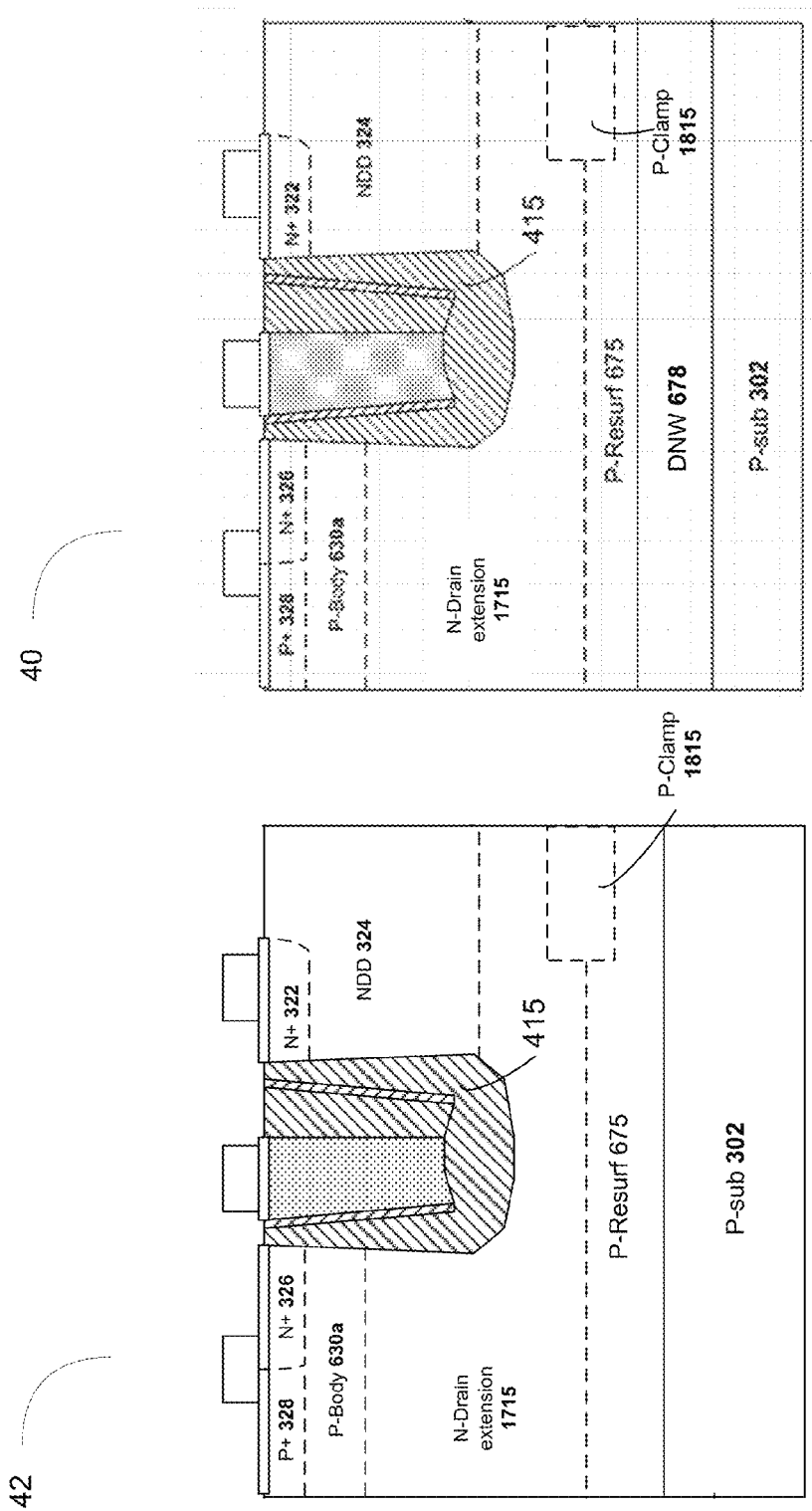

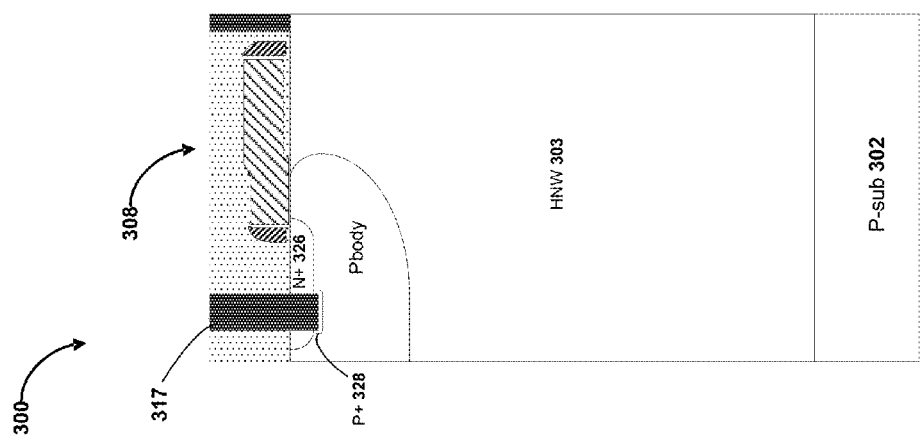

US 8,866,217 B2

VERTICAL GATE LDMOS DEVICE

CROSS REFERENCE TO RELATED APPLICATIONS

This application claims priority to U.S. Provisional Application No. 61/522,429, filed Aug. 11, 2011, the entire content of which is incorporated herein by reference.

TECHNICAL FIELD

The following disclosure relates to semiconductor devices, and more particularly to a lateral diffused MOSFET (LDMOS) device.

BACKGROUND

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be efficient DC to DC converters. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

Laterally diffused metal oxide semiconductor (LDMOS) transistors are used in switching regulators as a result of their low specific on-resistance and high drain to source breakdown voltage. The high breakdown voltage in such devices is achieved by having a sufficiently long drift region between the gate and the drain. A long drift region, on the other hand, increases the resistance between the gate and the drain, thereby reducing the drain current. A long drift region also results in an increased cell pitch.

SUMMARY

In general, in one aspect this disclosure features a transistor that includes an n-well region implanted into a surface of a substrate, and a trench in the n-well region. The trench has a first side and an opposing second side, and extends from the surface to a first depth. The trench includes a gate of conductive material in the trench, and dielectric material filling a volume of the trench not filled by the conductive material. The transistor also includes a p-type material in a first region extending from a second depth to a third depth in the n-well region, wherein each of the second depth and the third depth is greater than the first depth. The transistor further includes a source region and a drain region. The source region is on the first side of the trench and includes a p-body region extending from the surface to the first region, an n+ region and a p+ region implanted in the p-body region. The drain region is on the second side of the trench and includes an n+ region.

In another aspect, a method of fabricating a transistor includes implanting, into a surface of the substrate, an n-well region, and forming a trench in the n-well. The length of the trench extends from the surface of the n-well region to a first depth in the n-well region and the width of the trench extends from a first side on the surface of the n-well to a second side on the surface on the n-well. The method also includes implanting a p-type material in a first region extending from a second depth to a third depth in the n-well, wherein the p-type material in implanted through the bottom of the trench at the first depth and each of the second depth and the third depth is greater than the first depth. The method further includes implanting an n type material in a second region in the n-well such that the second region extends from the bottom of the trench to the first region. The n-type material is implanted through the bottom of the trench at the first depth. The method also includes forming an asymmetric gate of conductive material in the trench such that the distance of the asymmetric gate from the first side of the trench is less than the distance of the asymmetric gate from the second side of the trench, and filling, by an oxide, the volume of the trench not covered by the asymmetric gate. The method also includes implanting, into a source region of the transistor, a p-body region such that the p-body region extends from the surface of the n-well to the first region. The source region is at the first side of the trench. The method includes implanting, into the source region of the transistor, an n+ region and a p+ region, in the p-body region, and implanting, into a drain region of the transistor, an n+ region, wherein the drain region is at the second side of the trench.

In another aspect, a transistor includes an n-well region implanted into a surface of a substrate, and a trench in the n-well region. The trench has a first side and an opposing second side and extends from the surface to a first depth. The trench includes a gate of conductive material in the trench, and dielectric material that fills a volume of the trench not filled by the conductive material. The transistor also includes a source region on the first side of the trench. The source region includes a p-body region wherein an n+ region and a p+ region is implanted in the p-body region. The transistor further includes a drain region on the second side of the trench, the drain region comprising an n+ region, the n+ region abutting the trench.

In another aspect, a transistor includes an n-well region implanted into a surface of a substrate, and a trench in the n-well region. The trench has a first side and an opposing second side, and extends from the surface to a first depth. The trench includes a first dielectric material abutting the n-well on the first side and the opposing second side of the trench. The transistor further includes a source side dielectric liner on the first dielectric material on a source side of the trench, and a drain side dielectric liner on the first dielectric material on a drain side of the trench. The transistor also includes a gate of conductive material filling a first volume in the trench between the source side dielectric liner and the source side dielectric liner and abutting the source side dielectric liner. The first dielectric material fills a second volume of the trench between the source side dielectric liner and the source side dielectric liner not filled by the conductive material. The transistor also includes a source region on the first side of the trench, the source region including a p-body region. An n+ region and a p+ region are implanted in the p-body region. The transistor further includes a drain region on the second side of the trench, the drain region including an n+ region.

These and other aspects can optionally include one or more of the following features. A distance of the gate from the first side of the trench can be less than a distance of the gate from the second side of the trench. A breakdown voltage of the transistor can be substantially between a range 10V-100V. The conductive material can be polysilicon. The dielectric material can be an oxide. The first region can be below the trench and a width of the first region can be more than a width of the trench. The first region and the source region can define a channel through which a current flows around the trench from the source region to the drain region. A concentration of the p-type material in the first region can be lower than a concentration of the p-type material in the p-body region. The p-body region can include a deep p-body region and a shallow p-body region, the shallow p-body region being closer to the surface and having a higher concentration of the p-type material than the deep p-body region. The p-body region can extend from the surface to the first region. A gate electrode can be in electrical contact with the gate of the conductive material in the trench. A layer of silicide can be included between the gate electrode and the gate of conductive material in the trench. The p+ region of the p-body can be below the n+ region of the p-body. A first source electrode can be in contact with the p+ region and a second source electrode can be in contact with the n+ region. The p-type material in the first region can be a portion of an epitaxial layer. A layer of n-type material can be included between the epitaxial layer and the substrate. The p-type material in the first region can be a portion of a reduced surface field (RESURF) layer. A layer of n-type material can be included between the RESURF layer and the substrate.

Implanting the n type material in the second region can be configured such that the second region has a lower concentration of p type material than the p-body. The p-type material in the second region can be substantially neutralized by the implanted n type material. Forming the trench can further include depositing a masking layer on the n-well region, patterning the masking layer to define a site for the trench, and etching out a portion of the n-well region, at the site. The p-type material can be implanted in the first region using an implant beam having an implant angle between 0-30 degree and an implant energy between 50-500 KeV. The n-type material can be implanted in the second region using an implant beam having an implant angle between 0-30 degree and an implant energy between 50-450 KeV. Forming the asymmetric gate can include oxidizing the trench to increase the thickness of the oxide at the bottom of the trench. A layer of nitride can be formed on substantially vertical walls of the trench, the nitride layer configured to at least partially block oxidation of the walls. Implanting the p-body region can include forming and patterning a masking layer to expose a region on the surface of the substrate through which the p-body region is formed, implanting a deep p-body region using an implant beam having a first angle and a first energy, and implanting a shallow p-body region using an implant beam having a second angle and a second energy. The second angle can be greater than the first angle and the second energy can be less than the first energy. The shallow p-body can have a higher resultant implant concentration than the deep p-body. Metallic contacts can be formed at the source, gate and drain regions.

A p-type material in a first region can extend from a second depth to a third depth in the n-well region, wherein each of the second depth and the third depth is greater than the first depth. The source-side dielectric liner and the drain side dielectric liner can include silicon nitride. The first dielectric material can include silicon oxide.

Certain implementations may have one or more of the following advantages. The resistance between the source and drain may be reduced due to a reduction of a drift region between the gate and drain. The reduction in the drift region may lead to an increase in the current through the device. By having the current flow around a vertical trench, the cell pitch may be reduced without compromising on the high breakdown voltage characteristic of an LDMOS device. Cell pitches can be made tighter by reducing the width of the gate region. Capacitive losses between the gate and drain and/or the drain and source can be improved. This can also improve the tradeoff between the breakdown voltage and the drain to source resistance $R_{ds}$ for voltages greater than that supported by a lateral device. The location of the breakdown location can be tailored within a device for increased stability.

The details of one or more implementations are set forth in the accompanying drawings and the description below. Other features, aspects, and advantages will become apparent from the description, the drawings, and the claims.

DESCRIPTION OF DRAWINGS

Exemplary implementations will hereinafter be described in conjunction with the appended drawings, wherein like designations denote like elements, and wherein:

FIG. 5A is a schematic diagram showing current flow lines in an exemplary vertical gate LDMOS transistor.

FIG. 5B is a schematic diagram showing potential gradients in an exemplary vertical gate LDMOS transistor.

FIG. 5C is a schematic diagram showing distribution of electric field in an exemplary vertical gate LDMOS transistor.

FIGS. 18A-18B are schematic cross sectional views of example vertical gate LDMOS transistors in a buck converter.

FIG. 22 is a schematic cross sectional view of an LDMOS device.

DETAILED DESCRIPTION

Power electronics and systems are in a continuous push to continue to improve overall performance. Performance can be measured, for example, by power dissipation, electrical robustness/reliability, and cost. These metrics can be affected, for example, by the device architecture choices, circuit architecture choices. For example, the demand for lower power dissipation and switching loss has resulted in lower gate drive voltage levels while maintaining or improving drive current. The low voltage gate power devices, in turn can affect circuit architecture choices to ensure reliable gate bias without sacrificing performance. On the other hand, advanced driver circuits have enabled circuit topologies that are compatible with low gate voltage devices. There is an interplay between device architecture, circuit architecture, and general advances in semiconductor processing that drives innovation in each and all components of the system.

For example, planar LDMOS devices can be used to design and implement power conversion integrated circuits that exhibit robustness and low power dissipation. This continuing trend is pushing conventional LDMOS structures to approach the electrical limits characteristic of their topology. For example, LDMOS devices with dual gates can exhibit excellent breakdown voltage and drain current characteristics. In general, for such devices, the width of the gate has to be increased for higher breakdown voltages which in turn lead to an increased cell pitch and increased resistance between the drain and the source.

Figure 1:
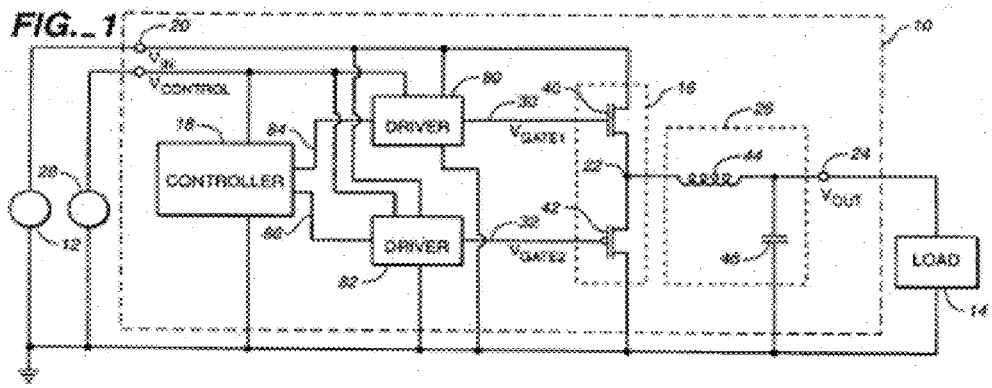
FIG. 1 is a circuit diagram of a buck converter.

Referring to FIG. 1, a switching regulator 10 is coupled to a first high DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 can include a first transistor 40, called a high-side transistor, having a source connected to the input terminal 20 and a drain connected to the intermediate terminal 22 and a second transistor 42, called a low-side transistor, or synchronous transistor, having a source connected to ground and a drain connected to the intermediate terminal 22.

In one implementation, the first transistor 40 can be a Positive-Channel Metal Oxide Semiconductor (PMOS) transistor, and the second transistor 42 can be a Negative-Channel Metal Oxide Semiconductor (NMOS) transistor. In another implementation, the first transistor 40 and the second transistor 42 can both be NMOS transistors. In another implementation, the first transistor 40 can be a PMOS, NMOS, or a Lateral Double-diffused Metal Oxide Semiconductor (LDMOS), and the second transistor 42 can be an LDMOS.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 44 connected between the intermediate terminal 22 and the output terminal 24 and a capacitor 46 connected in parallel with the load 14. During a high-side conduction period, the first transistor is closed, and the source 12 supplies energy to the load 14 and the inductor 44 via the first transistor 40. On the other hand, during a low-side conduction period, the second transistor 42 is closed, and current flows through the second transistor 42 as energy is supplied by the inductor 44. The resulting output voltage Vout is a substantially DC voltage.

The switching regulator also includes a controller 18, a high-side driver 80 and a low-side driver 82 for controlling the operation of the switching circuit 16. A first control line 30 connects the high-side transistor 40 to the high-side driver 80, and a second control line 32 connects the low-side transistor 42 to the low-side driver 82. The high-side and low-side drivers are connected to the controller 18 by control lines 84 and 86, respectively. The controller 18 causes the switching circuit 16 to alternate between high-side and low-side conduction periods so as to generate an intermediate voltage Vint at the intermediate terminal 22 that has a rectangular waveform. The controller 18 can also include a feedback circuit (not shown), which measures the output voltage and the current passing through the output terminal. Although the controller 18 is typically a pulse width modulator, the invention is also applicable to other modulation schemes, such as pulse frequency modulation.

Figure 2:
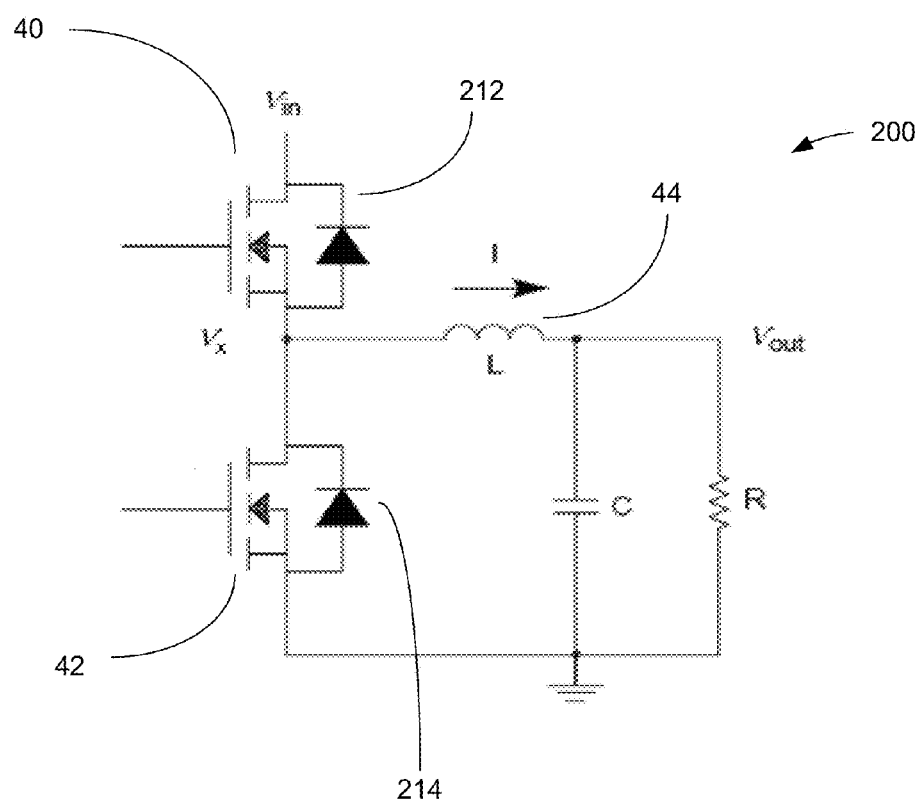
FIG. 2 is a simplified circuit diagram of a buck converter.

A simplified circuit diagram of a buck converter 200 is shown in FIG. 2. The buck converter 200 includes a high-side transistor 40, a low-side transistor 42, and an inductor 206. Each transistor has a corresponding intrinsic body diode, 212 and 214, respectively. A voltage Vin, for example 12V, is applied to the high-side transistor 40, and when the high-side transistor 40 is on, current will flow through the transistor 40 and the inductor 44. In contrast, when the low-side transistor 42 is on, the inductor 44 will pull current from ground. Under normal operation of the buck converter 200, the regulator will switch between turning the high-side transistor 40 and the low-side transistor 42 on so that the output of the filter 26 produces the desired voltage Vout (Vout is somewhere between 0V and Vin).

To improve efficiency of the buck converter 200, it is desirable to have the high-side transistor 40 on while the low-side transistor 42 is off, and vice versa. However, some downtime is required between the switching in order to avoid having both transistors 40, 42 on and at same time, which can cause shoot-through and result in significant efficiency losses and damage to the transistors. Thus, there is a short period, the intrinsic deadtime td, between each high-side conduction and low-side conduction period in which both transistors are open.

When both transistors 40, 42 are off, current through the inductor 44 will not instantly drop to zero. The voltage across the inductor is determined by Equation 1:

$$V = L(di/dt), \qquad \text{(Equation 1)}$$

where V is the voltage, L is the inductance, and i is the current in the inductor. As the inductor current decreases, the voltage at the input end, i.e. near Vin, of the inductor is forced to be negative. When this voltage reaches approximately −0.7 V, the low-side body diode 214 reaches its threshold voltage and begins conducting current into the inductor. As a result, in a traditional buck converter, the current will travel through the diode 214.

Figure 3:
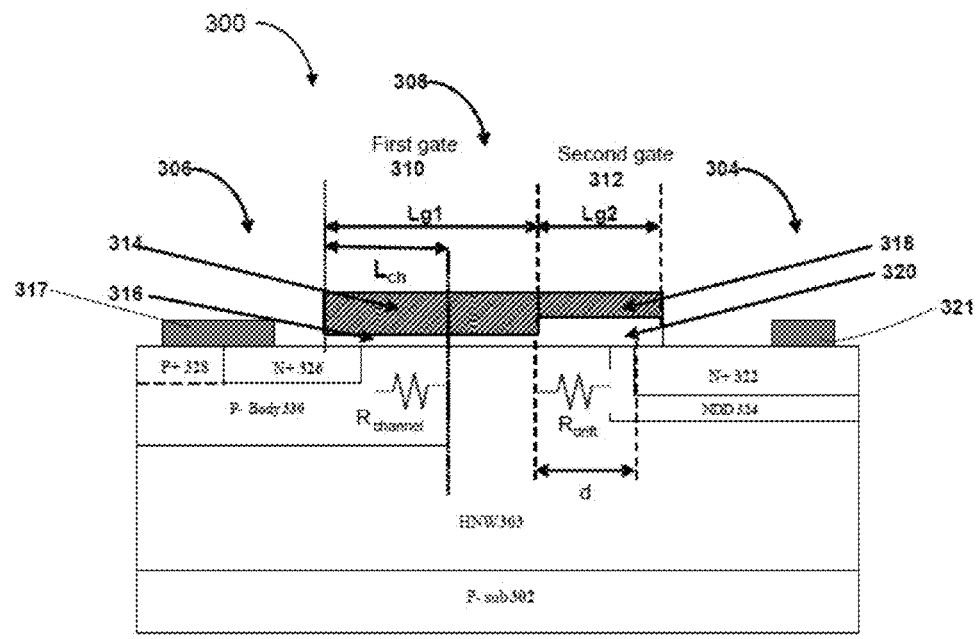
FIG. 3 is a schematic cross-sectional view of a LDMOS transistor.

Referring to FIG. 3, a schematic cross sectional view of a laterally diffused metal oxide semiconductor (LDMOS) transistor 300 is shown. In broad overview the transistor 300 includes a drain region 304, a source region 306 and a gate region 308. The transistor 300 can be fabricated on a high voltage n-type well (HNW) 303 on a p-type substrate 302. The gate 308 includes a conductive layer 314, e.g., polysilicon, disposed over a dielectric layer 316, e.g., an oxide, e.g., silicon oxide. The gate can be a stepped gate that includes a first gate region 310, e.g., on the source side of the gate, and a second gate region 312, e.g., on the drain side of the gate. The first gate region 310 includes a thin oxide layer 316a, and the second gate region 312 includes a thick oxide layer 316b.

The drain region 304 can include an n-doped n+ region 322 and an n doped shallow drain (NDD) 324. A drain electrode 321 can be disposed on the substrate in electrical connection with the n+ region 322. The source region 306 includes an n-doped n+ region 326, a p-doped p+ region 328, and a p-doped P-body 330. A source electrode 317 can be disposed on the substrate in electrical connection with the n+ region 326 and p+ region 328. In some implementations, the HNW 303 (which may be referred to as an n-well) is a deep implant and is generally more lightly doped than a conventional CMOS n-well. In some implementations, the HNW 303 can have a retrograded vertical doping profile.

In some implementations, the gate region 308 includes a first gate 310 on the source side and a second gate 312 on the drain side. The first gate 310 includes a dielectric layer 316, e.g., an oxide such as silicon oxide, and a conductive layer 314, e.g., polysilicon. The second gate 312 also includes a dielectric layer 320, e.g., an oxide such as silicon oxide, and a conductive layer 318, e.g., polysilicon. In some implementations, the oxide layer 320 is thicker than oxide layer 316. The thinner oxide layer 316 permits the transistor 300 to be controlled by a lower gate voltage relative to a device or transistor having a controlled gate with a thicker oxide layer. The thin oxide layer 316 also makes the transistor compatible with low linewidth process technologies (e.g. 0.18 μm or lower). The length Lg1 of the thin oxide layer 316 also affects the channel length $L_{ch}$ thereby affecting the associated resistance $R_{channel}$. In some implementations, the resistance $R_{channel}$ between the source and the gate is substantially proportional to the length $L_{ch}$. The thick oxide layer 320, on the other hand, allows the transistor 300 to have a high breakdown voltage in an OFF state. The length Lg2 of the thick oxide layer 320 affects the drift region d and the associated resistance $R_{drift}$. In general, the drift region is conducting even in the OFF state as no inversion takes place in this region. The resistance $R_{drift}$ is therefore deemed to be a parasitic resistance.

In some implementations, the dimensions of one or more of the first gate 310 and the second gate 312 can be configured to control certain characteristics. For example, the length of the first gate 310 Lg1 can be configured to control channel conductance, the length of the second gate Lg2 can be configured to control breakdown voltage and the total length Lg1+Lg2 can be configured to control a safe operating area (SOA). The channel length $L_{ch}$ affects parameters such as the resistance and operating characteristics of the transistor 300 and can be configured to control such parameters. For example, the turn-on voltage for the gate of the transistor 300 can be proportional to the channel length $L_{ch}$.

The LDMOS transistor, as shown in FIG. 3 can be implemented as a part of a device such as a power switch, e.g., as a power switch in a voltage regulator, e.g., as transistor 40 and/or transistor 42. Such devices are often configured to handle large currents and include multiple distributed transistors connected with each other. In such devices, electrical connection to the n+ regions 326 and p+ regions 328 can be made by contact pads in an overlying metal layer or current routing structure. In some cases, individual contact pads can contact both the n+ regions 326 and p+ regions 328. In such devices it can be desirable to have a high drain current ($I_{dlin}$) through the LDMOS transistor. One way to design a transistor with increased drain current is to reduce the length Lg2 of the thick oxide layer 320 such that $R_{drift}$ is reduced. Decreasing Lg2 also allows for a desirable reduction in cell pitch. However, reducing Lg2 lowers the breakdown voltage which is not desirable in a LDMOS transistor. In some cases, the breakdown voltage is also substantially a linear function of the cell pitch.

Figure 4:
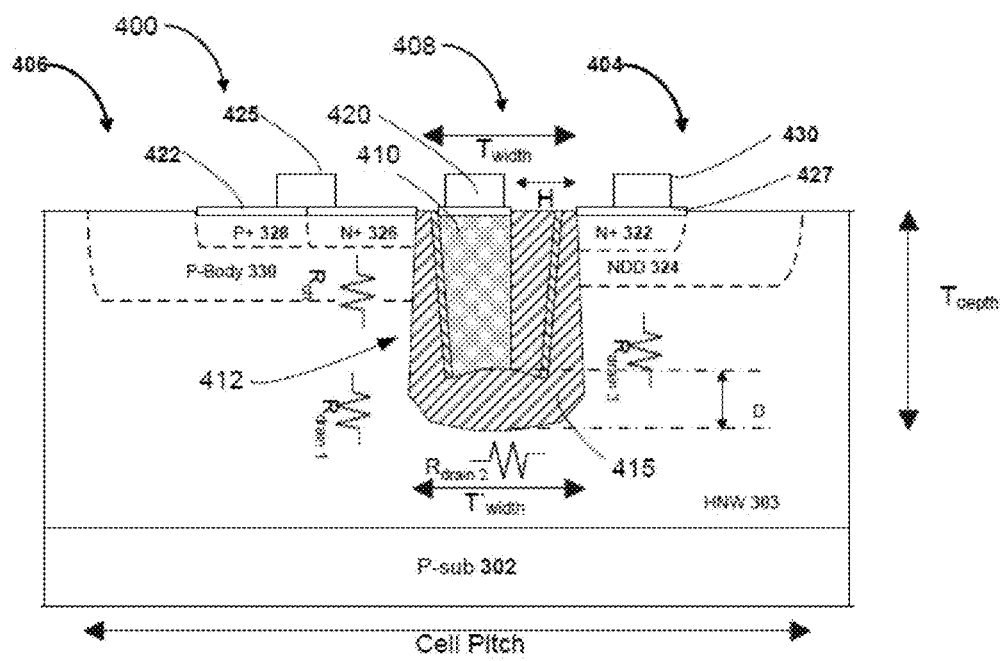
FIG. 4 is a schematic cross-sectional view of an LDMOS transistor with a vertical gate (or simply a "vertical gate LDMOS transistor").

In some implementations, the breakdown voltage can be maintained or even improved while reducing the cell pitch by placing the gate structure of the device in a vertical trench between the source and the drain. Referring now to FIG. 4, a schematic diagram shows the cross section of such a vertical gate LDMOS transistor 400. Again, this vertical gate LDMOS transistor 400 could be used as the transistor 40 and/or 42 in the voltage regulator. For example, the first transistor 40 can be a PMOS, NMOS, LDMOS or vertical gate LDMOS, and the second transistor 42 can be an LDMOS or vertical gate LDMOS, with at least one of the first transistor 40 or the second transistor 42 being a vertical gate LDMOS.

In the LDMOS transistor 400, the gate region 408 is entrenched in a vertical region between the source region 406 and the drain region 404. In general, the source region 406 and the drain region 404 are substantially similar to the source region 306 and drain region 304, respectively, of the transistor 300 described with respect to FIG. 3. However, the gate 408 is located in a vertical trench 412, i.e., a trench that extends downwardly below from the surface of the substrate. The gate region 408 includes a conducting portion 410 (e.g., polysilicon) laterally surrounded by a dielectric 415 such as an oxide. The dielectric 415 can also extend below the conducting portion 410, whereas the top surface of the conducting portion 410 can be substantially coplanar with the substrate surface and electrically connected to a conducting electrode 420. In some implementations, the gate 408 is asymmetric, with the conducting portion 410 closer to the source than the drain. This results in the thickness (i.e., the lateral thickness) of the dielectric, e.g., oxide, on the source side being less than that at the drain side. Such a configuration allows the breakdown voltage to be high.

The p-body 330 and the n+ region 326 abut the dielectric 415 of the trench 412 on the source side. The n+ region 326 and the p-body 330 extend downwardly from the surface of the substrate. The depth of the n+ region 326 is typically less than the depth of the p-body 330. The n+ region 326 can be embedded within the p-body 330. The p+ region 328 is also embedded in the p-body 330 and abuts the n+ region 326 on the side opposite the trench 412, such that the n+ region 326 is between the p+ region 328 and the trench 412. In some implementations, a layer of silicide 422 covers, at least in part, the surface of the p+ region 328 and the n+ region 326. The source side electrode 425 can be connected to the silicide layer 422.

The NDD region 324 and the n+ region 322, which extend downward from the surface of the substrate, abut the dielectric 415 of the trench 412 on the drain side. The n+ region 322 can be embedded within the NDD region 324. The depth of the NDD region 324 is greater than the n+ region 322. The n+ region 322 is covered, at least partially, by a silicide layer 427 to which the drain electrode 430 is connected.

The trench region can extend deeper into the substrate than the p-body 330 and/or the NDD region 324. In some implementations, both the dielectric 415 and the conducting portion 410 extend deeper into the substrate than both the p-body 330 and the NDD region 324. In some implementations, both the dielectric 415 and the conducting portion 410 are shallower than the p-body 330 and deeper than the NDD region 324. The dielectric portion of the trench 412 need not be covered by a silicide layer.

In general, the trench region has a depth of $T_{depth}$ from the surface of the substrate. The width of the trench at the surface can be denoted by $T_{width}$. In some implementations $T_{width}$ can also be referred to as a device pitch. The total width measured from the center of source/body contact to the center of drain contact is referred to as the cell pitch. In some implementations, the width of the trench can be substantially uniform throughout. In some implementations, the width $T'_{width}$ of the trench at depth $T_{depth}$ is slightly more than $T_{width}$. Also, as an example, the width $T_{width}$ of the trench can be less than the combined width (Lg1+Lg2) of the first and second gates in the transistor 300, the cell pitch is decreased, thereby allowing a higher density of transistors on a given surface area. The trench 412 can have an aspect ratio ($T_{depth}$:$T_{width}$) greater than 1.

In a vertical gate LDMOS transistor, such as the one shown in FIG. 4, a current flowing from the source 406 to the drain 404 flows through the HNW 303 around the trench. The resistances in the path of the current flow are depicted in FIG. 4 as $R_{ch}$, $R_{drain1}$, $R_{drain2}$ and $R_{drain3}$. In some implementations, the drain current $I_{dlin}$ in the transistor 400 is equal or greater than the corresponding current in the transistor 300 (assuming all other parameters to be substantially same) when:

$$R_{ch}+R_{drain1}+R_{drain2}+R_{drain3} <= R_{channel}+R_{drift} \quad \text{(Equation 2)}$$

The resistances $R_{ch}$, $R_{drain1}$, $R_{drain2}$ and $R_{drain3}$ as well as the gate to drain capacitance $C_{gd}$ and breakdown voltage BV can depend on several dimensions related to the trench. These dimensions can include the horizontal distance H between the conductive gate 410 and the drain, and the vertical distance D between the gate 410 and the HNW 303. In general, the horizontal distance H represents the thickness of the dielectric 415 on the drain side of the trench. Typically, the horizontal distance H is greater than the thickness of the dielectric on the source side, thereby leading to an asymmetric gate that exhibits a high BV. Similarly, the vertical distance D represents the thickness of the dielectric at the bottom of the trench. The dimensions also include the width of the trench $T_{width}$ and the depth of the trench $T_{depth}$.

In general, when other parameters are unchanged, an increase in $T_{width}$ results in an increase in the breakdown voltage. The breakdown voltage can also be controlled by adjusting the vertical and horizontal distances. For example, if H is increased while keeping the $T_{width}$ unchanged, the breakdown voltage is increased. Similarly, if D is increased while keeping $T_{depth}$ unchanged, the breakdown voltage is increased.

The resistances can also be controlled by adjusting the above parameters. For example, in general, the resistance $R_{drain2}$ increases with an increase in $T_{width}$. This is because, when other parameters are unchanged, an increase in $T_{width}$ increases the separation between the source and the drain. Similarly, the resistances $R_{drain1}$ and $R_{drain3}$ increase with $T_{depth}$. In some implementations, the trench dimensions can therefore be adjusted to achieve a desired breakdown voltage and/or total resistance between the source and the drain. In general, there is a trade-off between the breakdown voltage and the total resistance $R_{ds}$ between the source and drain. A higher breakdown voltage typically results in an increase in the $R_{ds}$. In some implementations, the dopant concentration along the current path can be optimized or otherwise controlled to achieve a desired trade-off point between the breakdown voltage and $R_{ds}$. In some implementations, the dimensions can also be adjusted in accordance with desired capacitance values within the transistor 400.

Using a vertical LDMOS transistor, a figure of merit of an LDMOS device can be improved, for example, by reducing one or more of the cell pitch or the device pitch, or increasing the linear current. For example, the cell pitch in a vertical LDMOS device can be reduced by a factor of about 1.5 (as compared to a lateral device) in a 8" process and by a factor greater than 2.5 in a 12" process. In some implementations, the device pitch can be reduced by a factor of 2 to 3, in an 8" process and a 12" process, respectively. In some implementations, the interconnect width can be reduced by a factor of 2 or more.

By vertically embedding the gate between the drain and the source, current can be made to flow around the vertical gate. Such an arrangement can reduce the cell pitch while maintaining or even improving breakdown voltage and drain current characteristics of the LDMOS device. By significantly reducing cell pitch compared to a conventional LDMOS devices, the effective on resistance ($Rds_{on}$) can be improved in a vertical LDMOS device. The improvement in $Rds_{on}$ is facilitated, for example, by the device's reduced planar dimension and also by the reduced planar footprint being amenable to integration with more advanced CMOS nodes. For example, having a smaller critical dimension (CD), i.e. the smallest dimension that can be reliably manufactured within a given process, and alignment control for the source/drain contact overhead allows the vertical structure to further leverage capabilities of processes in 12" facilities with capabilities below, for example, 0.13 μm. As a result, processes that have limited benefits in fabrication of conventional power devices can be used to fabricate power devices that include the vertical LDMOS structures. In addition, the new vertical LDMOS structure allows for further optimization of switching losses. For example, the gate 408 and drain 404 of the transistor 400 act as a vertical capacitor, sustaining the bulk of the voltage drop in the off-state across the dielectric. For this reason, the thickness of the dielectric 415 in a vertical LDMOS device is larger than the thick oxide 320 in a lateral transistor 300. The increased dielectric thickness at the drain can result in lower parasitic Miller capacitance. In general, the vertical LDMOS structure allows for optimizations for the breakdown voltage, $Rds_{on}$, and overall switching losses.

Referring now to FIG. 5A, a plot 505 shows the distribution of current flow within the vertical gate LDMOS transistor 400 during operation. The source 406, gate 408 and drain 404 are pointed out for reference. As shown, current flows around the trench from the source to drain in the transistor 400. That is, the current first flows downwardly (i.e., away from the substrate surface) on the source side of the trench, then laterally along the bottom side of the trench, then upwardly (i.e., toward the substrate surface) on the drain side of the trench. The current is high near the trench (highest adjacent the dielectric material of the trench) and decreases with distance from the trench.

FIG. 5B shows a plot 515 depicting the potential gradient within the vertical gate LDMOS transistor 400 using multiple substantially equi-potential surfaces. It can be observed that the source is at the lowest potential while the drain is at the highest potential. In some implementations, the distribution of the equi-potential surfaces can be controlled using for example, a shape of the p-body whose outline is demarcated in FIG. 5B by the line 525. Controlling the distribution of the equi-potential surfaces can be of interest for various reasons including, for example, controlling the capacitance (and hence capacitive losses) or current flow between the source and the drain.

Referring now to FIG. 5C, a plot 530 shows a distribution of electric field within the vertical gate LDMOS transistor 400. It can be seen that the electric field drops across the trench gate 408. In some implementations, such a drop facilitates breaking the unipolar limit to achieve a high breakdown voltage. The increase in breakdown voltage can be achieved without compromising, or in some cases, improving, the cell pitch. In some implementations a vertical gate LDMOS transistor 400 can be implemented using process technologies for linewidths 0.18 μm or lower.

Figure 6A:
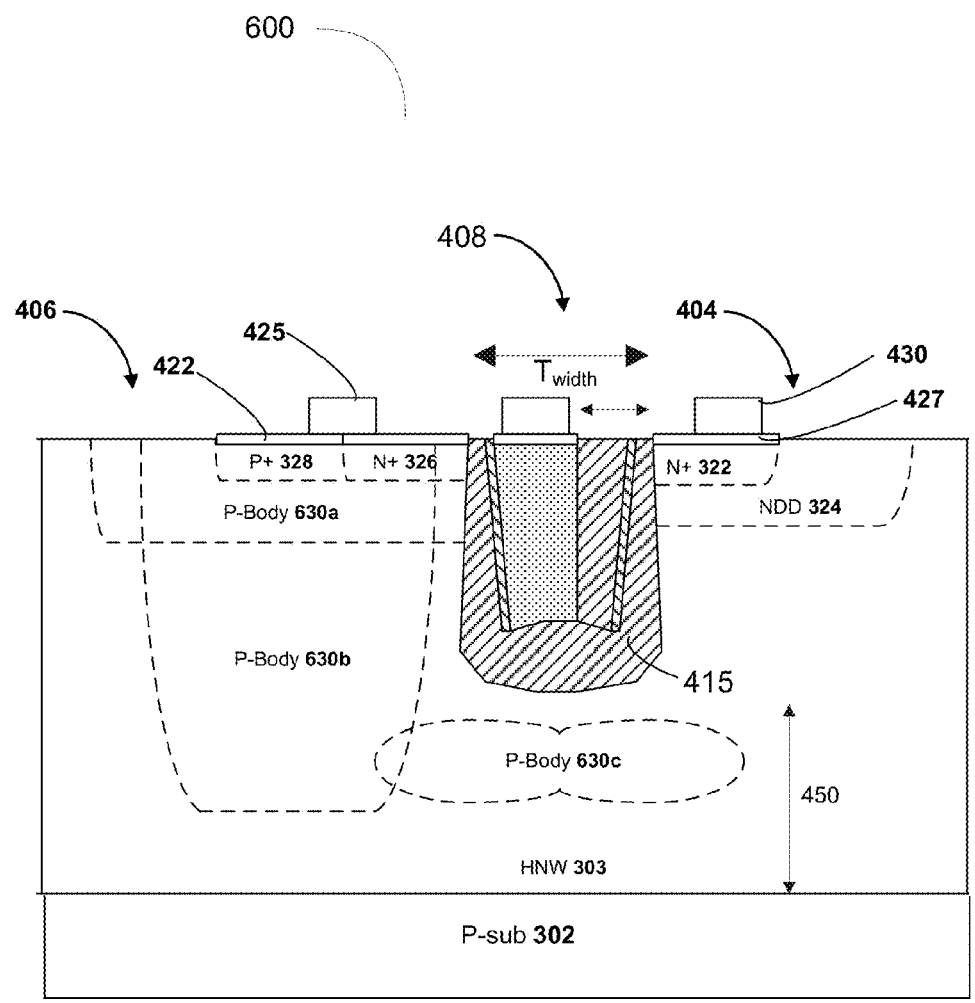
FIG. 6A-6E are examples of schematic cross sectional views of vertical gate LDMOS transistors.

In some implementations, the shape of the p-body 330 can be configured to control various electrical characteristics of a vertical gate LDMOS transistor including, for example, current flow, electric field, source to drain capacitance, and potential distribution. Referring now to FIG. 6A, a vertical gate LDMOS transistor 600 with an extended p-body is shown. The vertical transistor 600 is substantially similar to the transistor 400 described with reference to FIG. 4 except for the p-body 630. In some implementations, the transistor 600 includes an extended p-body 630. The p-body 630 can be shaped in accordance with a desired current flow channel between the source and the drain. In the example shown in FIG. 6A, the p-body 630 includes three regions, a first p-body region 630*a* that is adjacent to the n+ region 326 and p+ region 328 of the source 406, a third p-body region 630*c* that extends below the trench gate 408, and a second p-body region 630*b* that connects the first p-body region 630*a* with the third p-body region 630*c*. The third p-body region 630*c* is sometimes referred to as a "p-body foot."

The first p-body region 630*a* abuts the trench 412 on the source side. The p+ region 328 and the n+ region 326 are embedded in the first p-body 630*a*. The depth of the first p-body 630*a* is greater than the p+ region 328 and the n+ region 326, which can be of substantially equal depth. The first p-body 630*a* extends laterally beyond the p+ and n+ regions in a direction away from the trench. In some implementations, a layer of silicide 422 covers, at least in part, the surface of the p+ region 328 and the n+ region 326. The source side electrode 425 can be connected to the silicide layer 422.

The second p-body region 630*b* connects the first p-body region 630*a* with the third p-body region 630*c*. The second p-body region 630*b* extends below the first p-body region 630*a*. However, the portion of the second p-body region 630*b* near the surface of the substrate can overlap with or blend into the first p-body region 630*a* and the third p-body region 630*c*. The width or lateral spread of the second p-body region 630*b* can be less than that of the first p-body region 630*a*. The second p-body 630 does not abut the trench 412, e.g., the second p-body is spaced apart from the trench 412 by a substantially undoped semiconductor region. The first p-body 630*a* can extend laterally beyond the second p-body 630*b* in a direction away from the trench.

The third p-body region 630*c* can be vertically separated from the trench; a volume of no doping, low p-doping (compared to the p-body) or n-doping can be located between the trench and the third p-body region 630*c*. On the source side, the third p-body 630*c* can overlap or blend into the second p-body region 630*b*. On the drain side, the third p-body 630*c* can extend laterally past the trench, e.g., the drain-side boundary of the third p-body 630*c* can be located laterally between (but vertically below) the trench and the side of the n+ region 322 farther from the trench. On the drain-side of the trench, the HNW 303 can be the only doped region between the third p-body region 630*c* and the NDD region 324. In general, the third p-body region 630*c* has a lower dopant concentration than the first and second p-body regions. Also, the first p-body region 630*a* can have a higher dopant concentration than the second p-body region 630*b*.

Figures 7A, 7B:
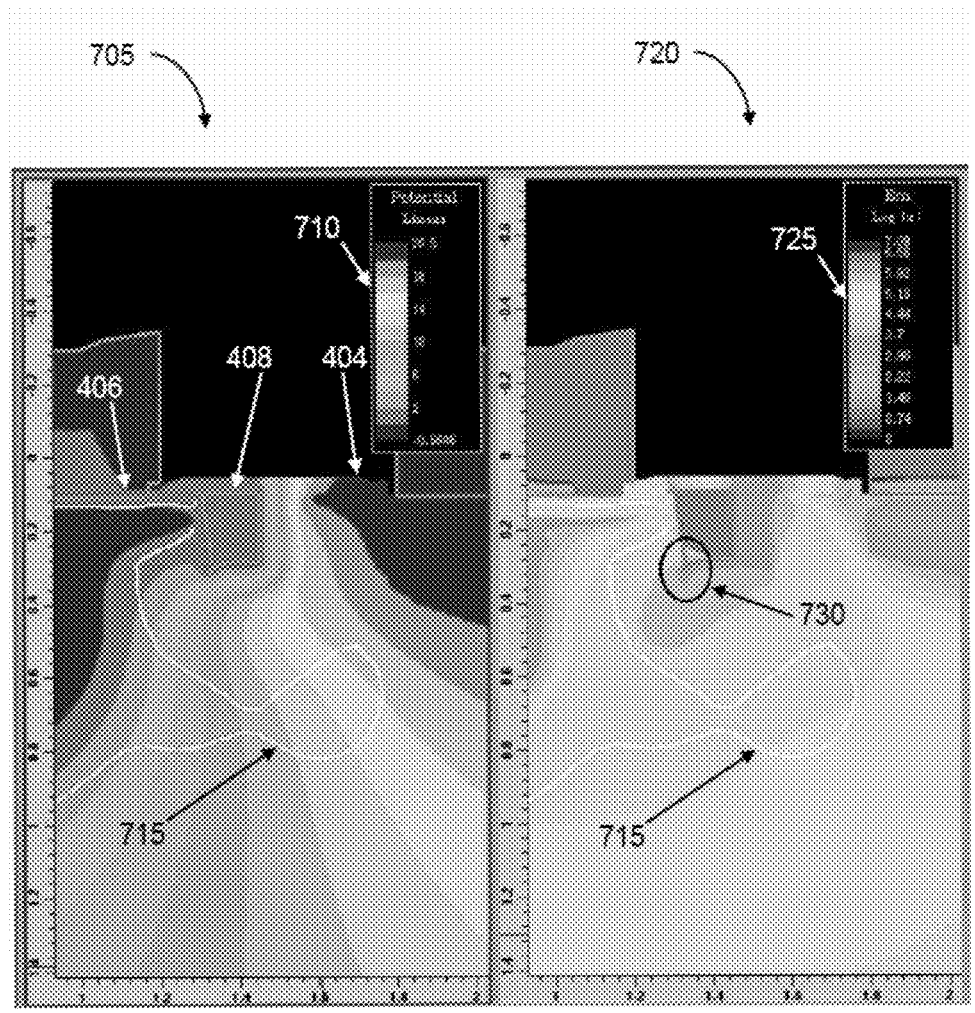
FIG. 7A is a diagram showing potential gradients in an exemplary vertical gate LDMOS transistor.
FIG. 7B is a diagram showing distribution of electric field in an exemplary vertical gate LDMOS transistor.

Referring now to FIG. 7A, a plot 705 shows an exemplary potential distribution in a vertical gate LDMOS transistor 600. The substantially equi-potential regions are denoted by a same shade. Using the legend 710, it can be seen that the potential is highest at the drain and the lowest at the source. The region in between the highest and lowest potential regions can be referred to as a potential gradient. Comparing the potential distribution shown in FIG. 7A with that shown in FIG. 5B, it can be seen that the particular profile or shape of the p-body 630 (denoted by the line 715) results in a higher separation between high and low potential regions. Such spreading of the potential gradient can have several advantages, including but not limited to a reduction in capacitance (and hence capacitive losses) within the transistor 600.

Even though the p-body is represented in FIG. 6A as three separate and distinct structures, an actual transistor will have one combined resultant p-body 630. Other shapes of the p-body 630 that result in a spreading of the potential gradient, as compared to for example the implementation of the FIG. 4, are also possible.

In some implementations, the effects of the p-body foot can be emulated or approximated with a structure having a shallow n-well or HNW 303 where a gap 450 between the trench region and the substrate 302 is reduced. This allows the substrate profile and potential to achieve voltage gradients similar to that achieved using the p-body foot.

Figure 6B:
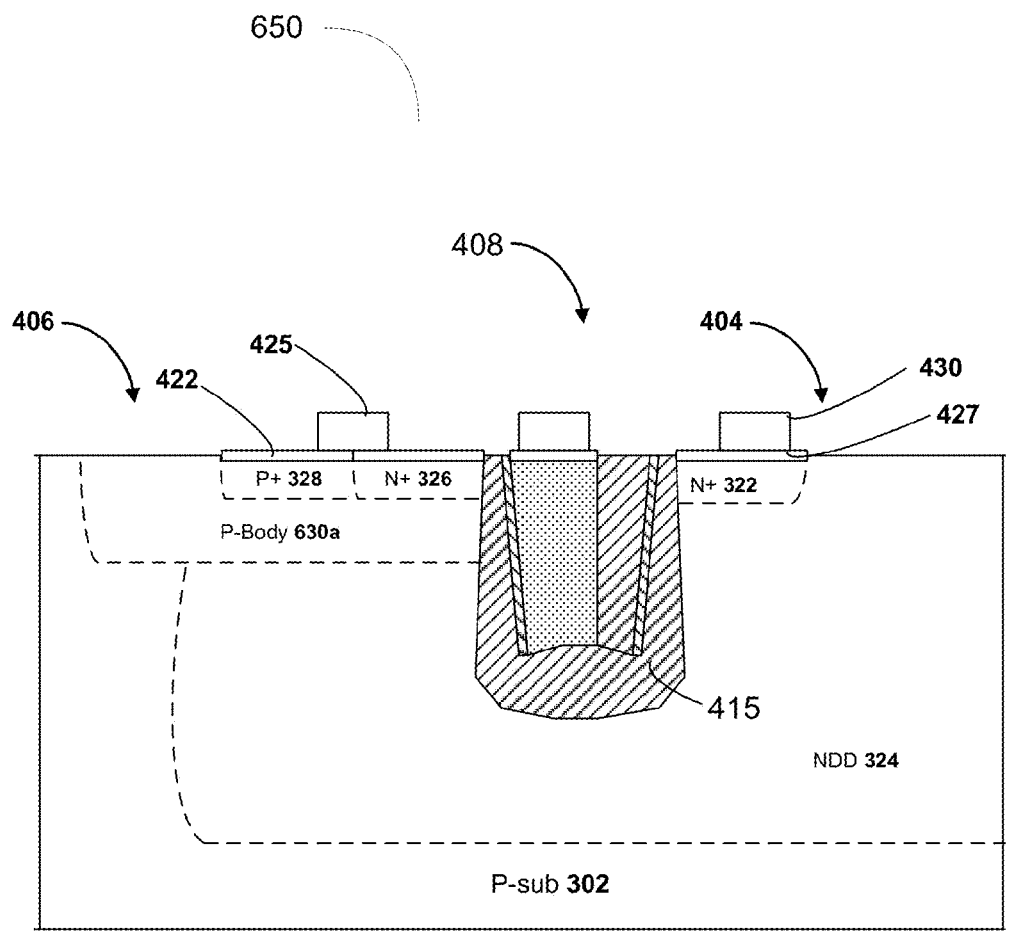

Other configurations of the vertical LDMOS device can also be used to achieve the spreading of the potential gradient that leads to an increase in the breakdown voltage. Examples of such configurations are shown in FIGS. 6B-6E. Each of these configurations include a p-type region extending below the trench region to spread the potential gradient. In the example configuration of FIG. 6B, the p-type substrate 302 is used to spread the potential gradient. In this configuration, the gate region 408 and the source region 406 are formed on the substrate 302. The NDD 324 is then implanted such that at least a portion of the NDD 324 is below the trench as well as the p-body 630*a*. In the example of FIG. 6B, the substrate P-sub 302 serves a purpose analogous to that of the p-body foot. Such a configuration can be used in a non-floating device where the source region 406 and the p-sub 302 are at ground potential.

Figure 6C:
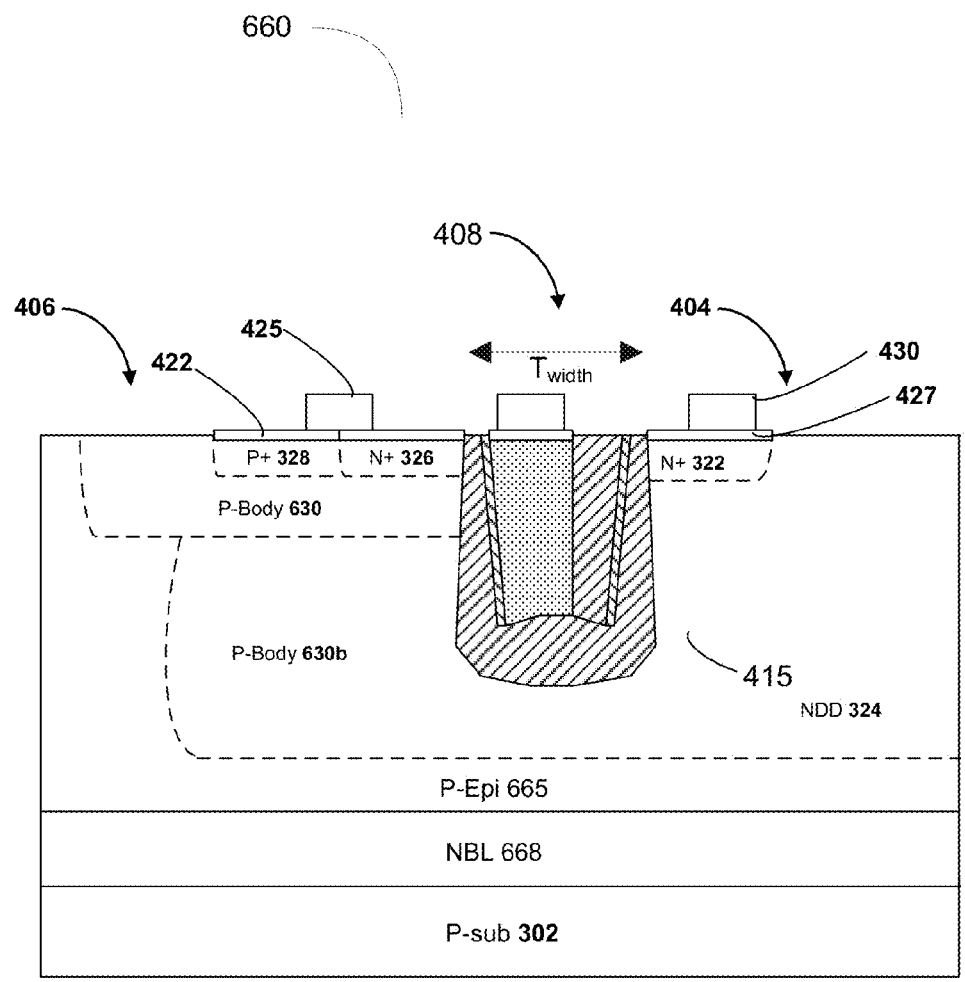

FIG. 6C depicts another example configuration of a vertical LDMOS device where a p type epitaxial layer p-epi 665 is used for spreading the potential gradient. The configuration of FIG. 6C also includes a layer of n-type material such as a high conductance N-buried layer (NBL) 668 between the p-epi 665 and the substrate 302. The NBL 668 is connected to the drain region 404 through an n-sink region (not shown in FIG. 6C) implanted in an inactive area of the device. The NBL 668 can be, for example, an n type buried layer used for isolation and/or conductivity improvement. The dopant concentration of the n-sink region is usually higher than the dopant concentration of the NBL 668. The vertical LDMOS device depicted in FIG. 6C can be fabricated from a wafer that includes the NBL layer 668 and the p-epi 665 over the substrate 302.

Figure 6D:
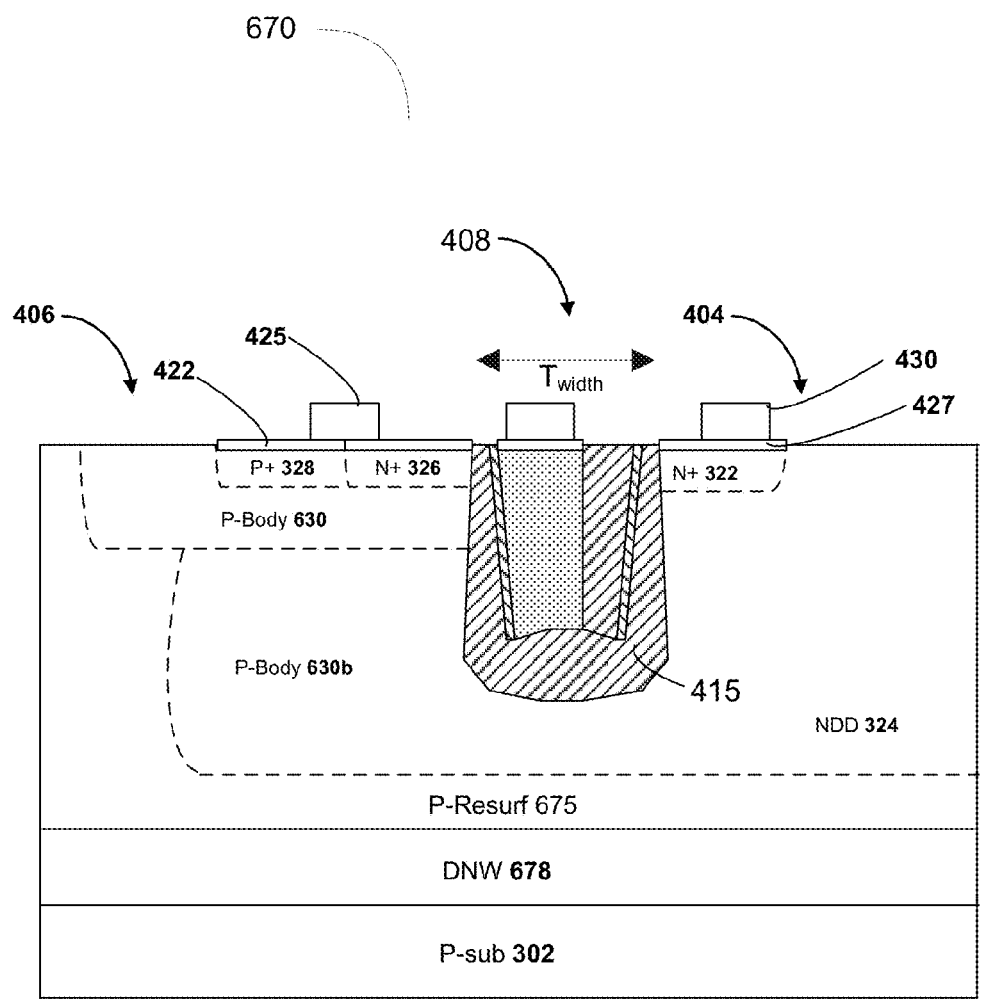
Figure 6E:
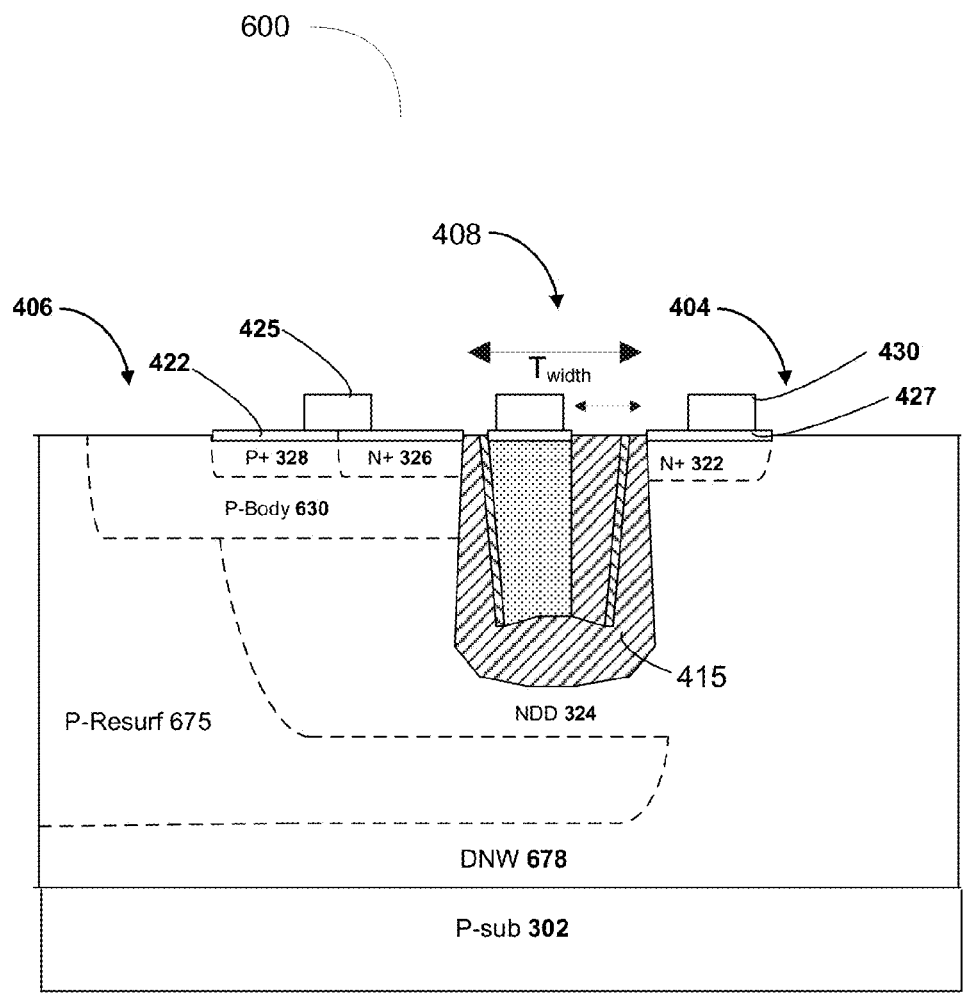

FIG. 6D depicts yet another example configuration of the vertical LDMOS device that includes a p-type reduced surface field (RESURF) layer p-resurf 675 for spreading the potential gradient. The configuration of FIG. 6D also includes a deep N well (DNW) layer 678 between the p-resurf 675 and the substrate 302. In some implementations the DNW is substantially similar to the HNW 303, possibly deeper and with lighter doping. A high energy n-type doping is used to form the DNW 678, followed by a medium energy p-type implantation to form the p-resurf 675. The other portions of the device can then be fabricated in the p-resurf layer 675. In some implementations, the p-resurf 675 can be implanted such that it extends below the trench but not across the entire device. FIG. 6E shows an example of such a configuration. In this configuration, the p-resurf 675 is implanted using a mask.

In the examples depicted in FIGS. 6A-6E, the p-type region (p-body 630c in FIG. 6A, substrate 302 in FIG. 6B, p-epi 665 in FIG. 6C, and p-resurf 675 in FIGS. 6D and 6E) used for spreading the potential gradient is shown to be connected to the p-body region 630. However, in some implementations, the p-type region can be formed as an island below the trench. In some implementations, this can reduce the capacitance of the device. In some implementations, connecting the p-type region to the p-body region 630 can facilitate better DC blocking capabilities at the expense of higher capacitive losses.

In general, the capacitance between two equi-potential regions is inversely proportional to the distance between them. Therefore, the capacitance between the equi-potential regions can be reduced by spreading the potential difference over a larger distance. In other words, if the width of the potential gradient region is increased, the capacitance between the source and the drain is decreased, leading to reduced capacitive losses. Without being limited to any particular theory, a p-body profile, such as shown in FIG. 6 or represented in FIG. 7A by the line 715, leads to a change in the capacitance of the transistor and hence a change in the capacitive losses. For example, if the p-body is shaped such that the width of the potential gradient region is increased (as shown for example in FIG. 7A), the capacitance between the source and drain, $C_{ds}$ is reduced. In some implementations, the increase in the width of the potential gradient can also result in decreased capacitances $C_{pb-nwl}$ between the p-body 630 and the HNW 303 and $C_{nwl-psub}$ between the HNW 303 and the p-type substrate 302.

Referring now to FIG. 7B, an exemplary distribution of electric field within a vertical gate LDMOS transistor is shown. In some implementations, a portion of the trench gate forms a beak-like protrusion 730 as shown in FIG. 7B, although some implementations lack such a protrusion, and can have rounded corners. In general, the asymmetric gate results in a high electric filed region near the trench and therefore the current from the source to the drain flows around the trench (first downward, then sideways and finally upward again) through a channel formed in the region between the p-body and the asymmetric gate.

Although FIGS. 5A-5C and 7A-7B show distinct volumes of equal current, potential or electric field, this is merely a limitation of the illustration, and in an actual device the current, potential and electric field would vary in a continuous manner.

Figure 8:
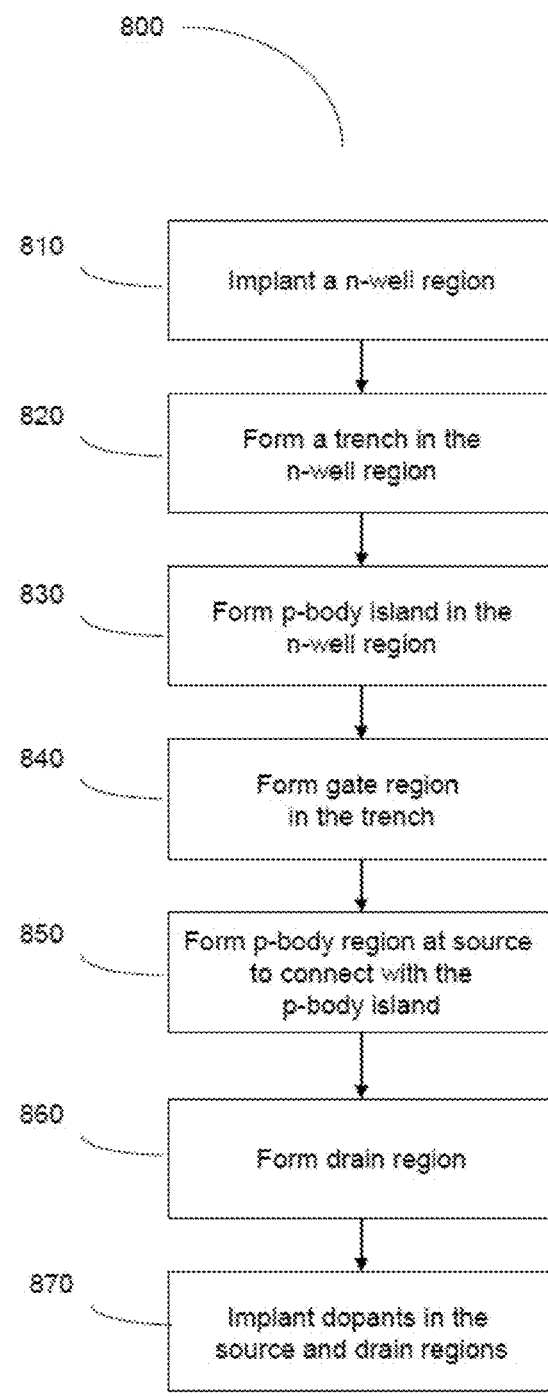
FIG. 8 is a flowchart showing fabrication steps for a vertical gate LDMOS transistor.
Figure 9A:
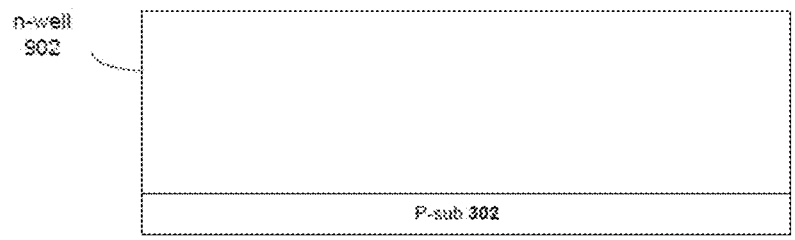
FIGS. 9A-9U are schematic cross-sectional views of a vertical gate LDMOS transistor in various stages of fabrication.

Referring now to FIG. 8, a flow diagram represents exemplary steps of a process 800 of fabricating a vertical gate LDMOS transistor (e.g., transistor 600). The process 800 includes implanting an n-well region (step 810) on a silicon substrate. This step is schematically depicted in FIG. 9A. The substrate can be a p type substrate 302 as shown in FIG. 9A or an n type substrate. In some implementations, the implanted well 902 can be a high voltage n-type well HNW 303 as described with respect to FIG. 3.

Figure 9B:
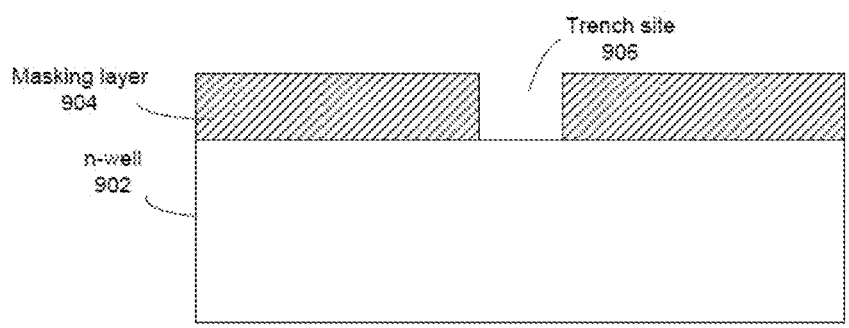
Figure 9C:
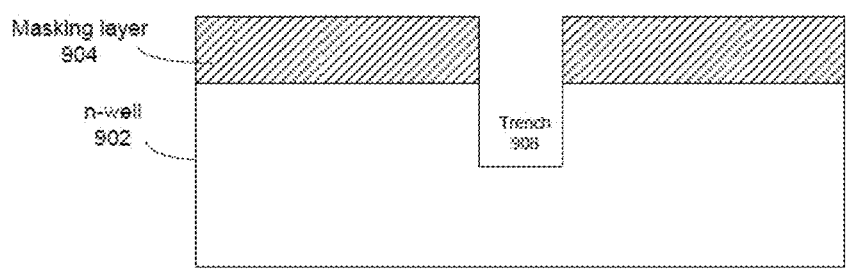

Referring back to FIG. 8, the process 800 also includes forming a trench in the n-well region (step 820). This step is described in more details with reference to FIGS. 9B and 9C. Please note that the substrate has been omitted from FIGS. 9B-9U for brevity. In some implementations, forming the trench (step 820) includes depositing a masking layer 904 (such as an oxide) on the implanted n-well 902 and subsequently patterning the masking layer to define the trench site 906. This step is depicted in FIG. 9B. The patterning can be done by depositing a photoresist material on the masking layer 904, patterning photoresist material using conventional photolithography techniques, and then etching masking layer 904 using the photoresist as a mask. The trench 908 is then formed by etching out a portion of substrate, e.g., the n-well 902, at the trench site 906. In some implementations, the etching can be done using deep reactive ion etching. The photoresist can be stripped before etching of the substrate to form the trench site 906. Alternatively, in some implementations, the photoresist can still remain on the masking layer 904 during the etching of the substrate.

Figure 9D:
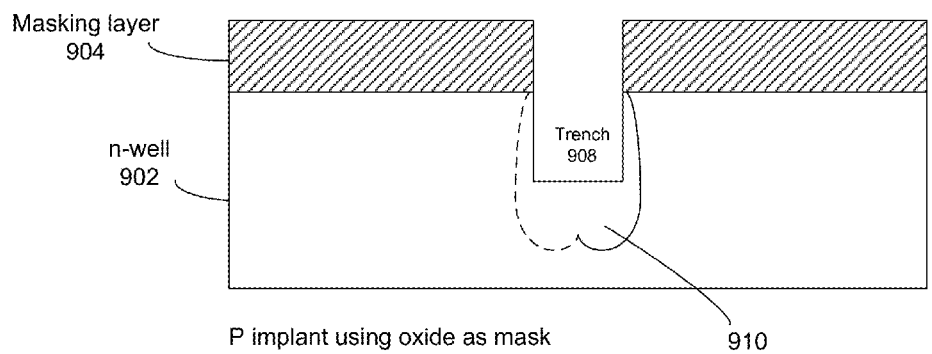

Referring again to FIG. 8, the process 800 further includes forming the p-body for the transistor. In some implementations, this can include forming several interconnected p-body regions separately. In this example, we describe forming a p-body region 630 as described with respect to FIG. 6. For forming such a p-body region, the process 800 includes first forming an island p-body region (step 830) substantially similar to the third p-body region 630c as described with respect to FIG. 6. Forming the p-body island (step 830) is described also with reference to FIGS. 9D-9E. In some implementations, forming the p-body island (step 830) includes implanting a p-type material into a region 910 within the n-well 902. The masking layer (e.g. the oxide) is used as a mask for this implant step. In some implementations, the photoresist can still remain on the masking layer 904 during the implantation and serve as an additional masking layer. The p-type region 910 is formed by using a low angle and high energy implant beam through the trench 908. The angle is measured with respect to a normal such that a beam with the lowest possible angle is a substantially vertical beam. Such an implant beam through the trench typically implants the p-type material through the bottom as well as the walls of the trench and forms an irregular shaped region, an example 910 of which is shown in FIG. 9D, with a thin portion immediately adjacent the side walls and a thick portion extending below the trench.

Figure 9E:
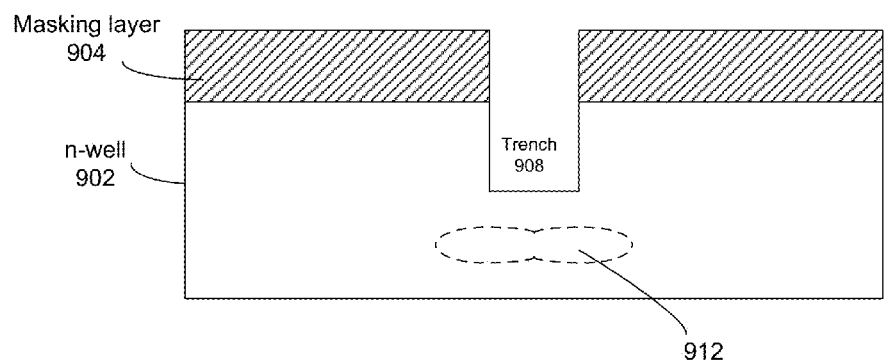

Forming the p-body island (step 830) can also include implanting an n-type material through the trench 908 in order to neutralize a part of the p-type region 910. This is schematically depicted in FIG. 9E. The angle of the implant beam used to implant the n-type material is substantially similar to the p-type implant beam described with respect to FIG. 9D. The energy of the n-type implant beam is typically less than that of the p-type beam such that the n-type implants penetrate a shorter distance into the n-well 902 than the p-type beam. Using lower energy but a substantially similar implant angle for the n-type beam helps neutralize the p-type region adjacent to the trench 908 and results in the p-type island 912 (which can provide the third p-body region 630c) that is separated from the trench by a region of no doping, lower p-doping (compared to the p-body island) or low n-type doping. In some implementations, the implant energy for the p-type material is between 50-500 KeV and that for the n-type material is between 50-450 KeV. The implant angle for both the p-type and n-type material can be, for example, between 0-30 degrees. The masking layer 904 is again used as a mask for this implant step.

Figure 9F:
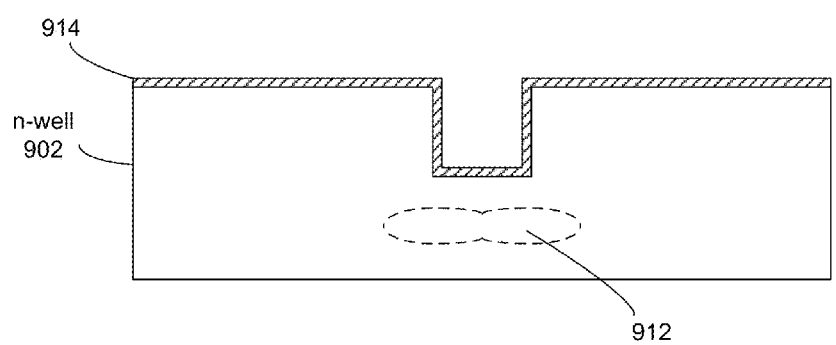

Referring back to FIG. 8, the process 800 further includes forming a gate region in the trench (step 840). Forming the trench gate is described in details with reference to FIGS. 9F-9O. In some implementations, the thick masking layer 904 is stripped or removed followed by formation of a thin layer of thermal oxide 914. The thermal oxide (e.g. $SiO_2$) is formed such that the layer covers the walls and the bottom of the trench 908 as shown in FIG. 9F. In some cases, the thin layer of thermal oxide 914 can be deposited in the trench 908 before removing the masking layer 904. In such cases, the masking layer 904 can be partially removed to a thickness substantially similar to the thickness of the thermal oxide 914 inside the trench. The thermal oxide can be formed by either a dry (using molecular oxygen as the oxidant) or a wet (using water vapor as the oxidant) process.

Figure 9G:
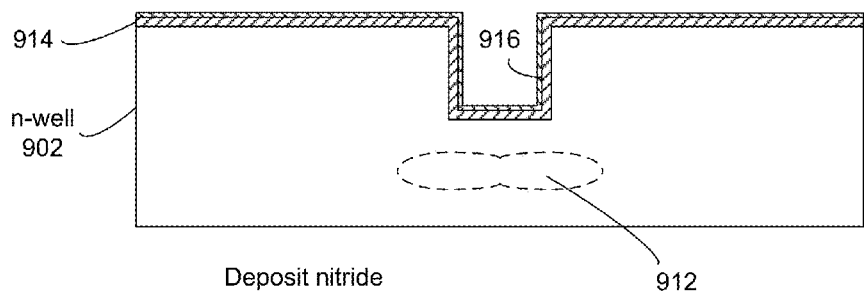

Referring now to FIG. 9G, a layer of nitride (e.g. silicon nitride) 916 is deposited over the thermal oxide layer 914 such that the nitride covers the walls as well as the bottom of the trench. In some implementations, the nitride layer can be deposited over the thermal oxide layer 914 in the trench without depositing over the thermal oxide layer outside the trench. This can be done by using a suitable mask that allows deposition only within the trench.

Figure 9H:
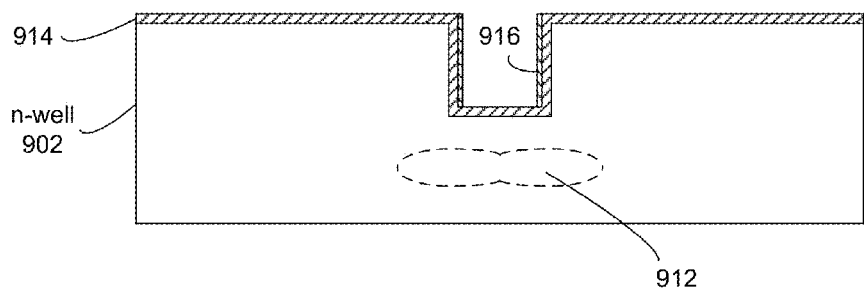

Referring to FIG. 9H, the nitride layer is then etched such that the nitride remains only on the walls of the trench. This can be done using a highly directional process such as deep reactive ion etching. Such a directional process leaves a layer of nitride 916 on the trench walls and removes the nitride layer from over rest of the thermal oxide layer 914. The nitride layer 916 thus formed acts as a mask that masks the trench walls from subsequent oxidation process.

Figure 9I:
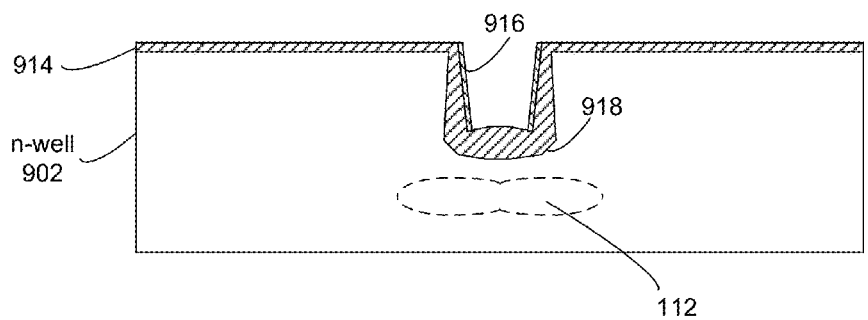

Referring now to FIG. 9I, the trench region is further oxidized to increase the thickness of the oxide at the bottom of the trench. The oxidation can be done using molecular oxygen (dry process) or water vapor (wet process). Typically, the nitride layer blocks the diffusion of molecular oxygen or water vapor and acts as a mask for the process. In general, the nitride layer does not produce sharp masking due to some diffusion of oxidant molecules lateral to the masked surface. In such cases, the oxide protrudes to the regions covered by the nitride thereby thickening the oxide layer surrounding the trench wall. The oxidation of the trench therefore produces a thickened oxide region 918 as shown in FIG. 9I.

Figure 9J:
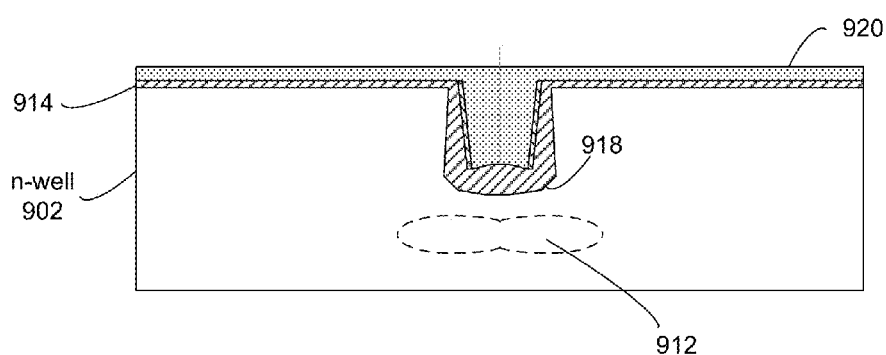

Referring now to FIG. 9J, the trench is filled with a conducting material, such as polysilicon, by depositing the conducting material over the entire exposed surface. This results in a layer of polysilicon 920 over the oxidized region 918 as well as the layer of thermal oxide 914. In some implementations, the nitride layer 916 can be removed prior to depositing the polysilicon.

Figure 9K:
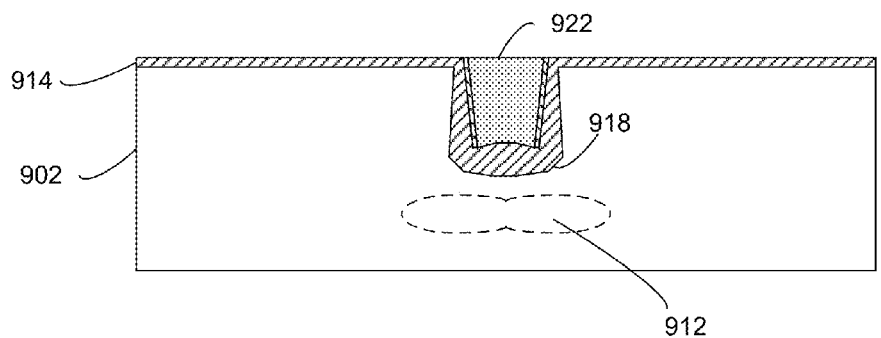

Referring now to FIG. 9K, the polysilicon layer 920 is polished such that the polysilicon is removed from over the thermal oxide layer 914 but still fills the trench. As a result the top surface of the polysilicon in the trench can be substantially coplanar with the top surface of the thermal oxide layer 914. The removal of polysilicon can be done using polishing processes such as chemical-mechanical planarization (CMP). The CMP process can proceed until the thermal oxide layer 914 is exposed, thus leaving polysilicon in the trench.

Figure 9L:
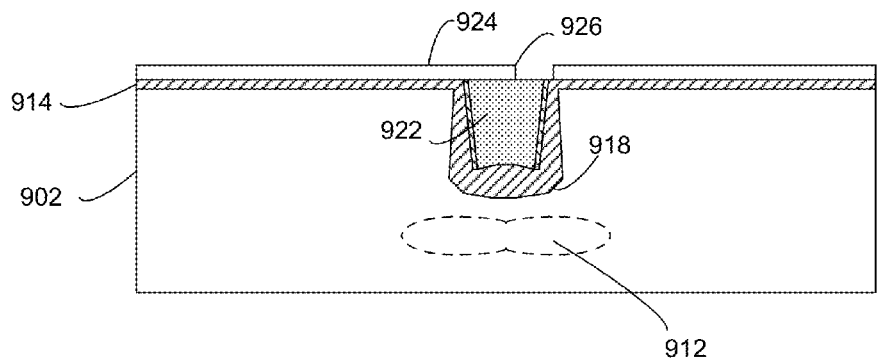
Figure 9M:
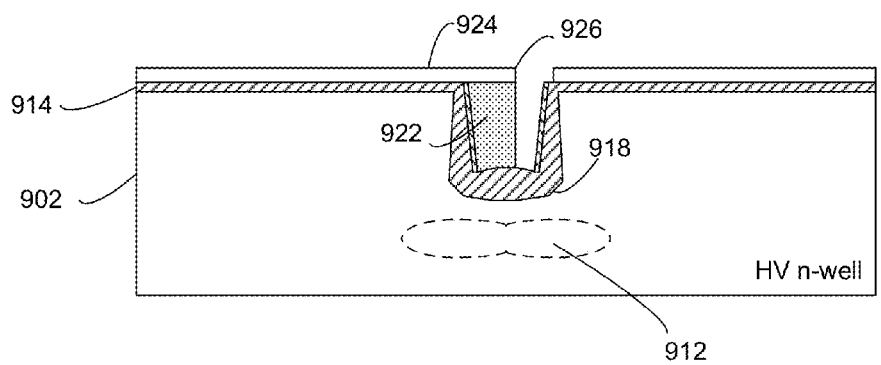

To provide the asymmetric gate region of a vertical gate LDMOS transistor, such as the transistor 600, a portion of the polysilicon is removed from the trench. This is schematically shown in FIGS. 9L-9M. Referring to FIG. 9L, a masking layer 924 (such as a photoresist) is deposited and patterned to expose a region 926 where polysilicon will be removed. In general, the photoresist mask is not self-aligned to the trench. Nevertheless, the exposed region 926 can be closer to the drain side than the source side of the trench. The exposed region 926 can overlap the nitride wall and oxide region 918. Referring now to FIG. 9M, a highly directional etching process, such as deep reactive ion etching, is used to remove the exposed portion of the polysilicon from the trench, thereby creating a recess in the trench.

Figure 9N:
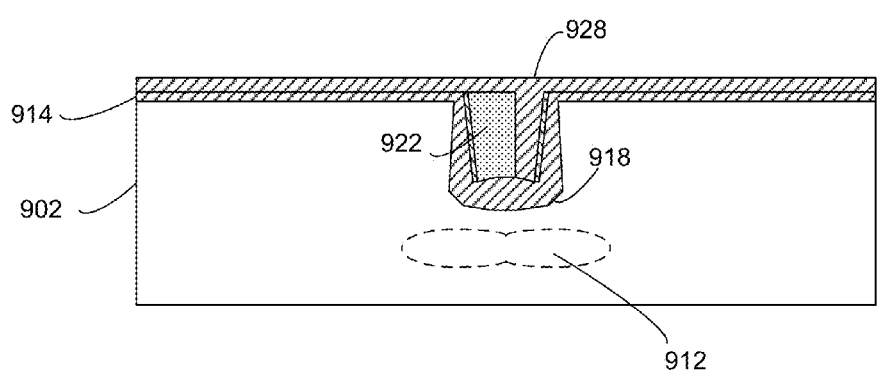
Figure 9O:
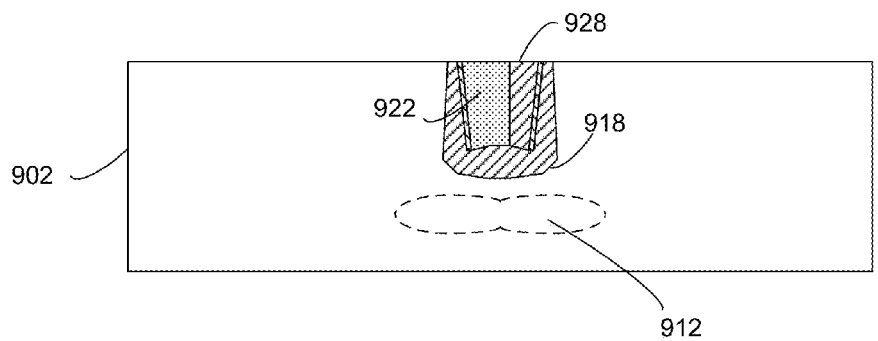

Referring now to FIG. 9N, the photoresist is removed and oxide 928 is deposited such that the deposited oxide refills the recess in the trench. The excess oxide is then removed via a planarization process such as CMP, exposing the substrate (e.g., the n-well 902). This is shown in FIG. 9O. The oxide 928 within the trench, in combination with the polysilicon 922 forms the asymmetric gate of the vertical gate LDMOS transistor.

Referring back to FIG. 8, the process 800 also includes forming a p-body region (step 850) at the source of the vertical gate LDMOS transistor such that the p-body region connects with the p-body island 912 described with reference to FIG. 9E. In some implementations, forming the p-body region (step 850) includes separately forming two p-body regions such as the first 630*a* and second 630*b* p-body regions described with reference to FIG. 6.

Figure 9P:
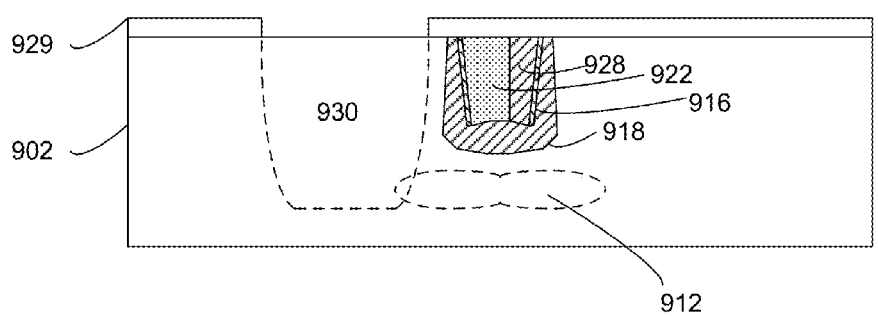

Referring now to FIG. 9P, forming a deep p-body region 930 (which can provide the second p-body region 630*b*) is shown. Forming the deep p-body can include forming and patterning a masking layer 929 that exposes only the region where the deep p-body 930 is formed. P-type material is then implanted in the exposed region, e.g., using an implant beam. In some implementations, the deep p-body 930 can be implanted using a low angle and high energy implant. The high energy of the implant allows the second p-body 930 to be formed deep into the HNW 303 while the low angle reduces a lateral spread of the deep p-body. In some implementations, the dopant concentration of the deep p-body 930 can also be controlled in accordance with a desired doping profile.

Figure 9Q:
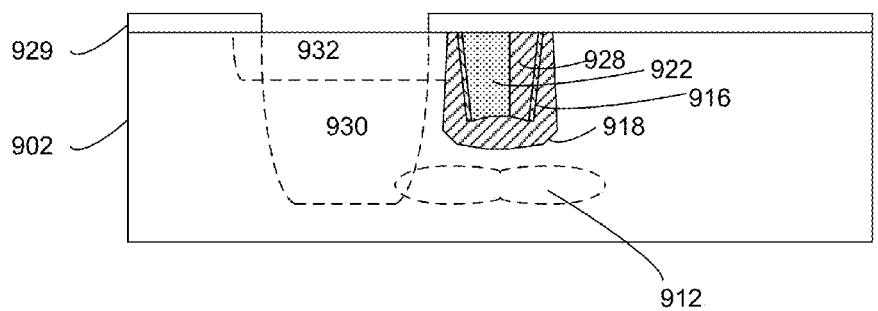

Referring to FIG. 9Q, forming the p-body region can also include forming a shallow p-body 932 (which can provide the first p-body region 630*a*). Typically, the shallow p-body 932 has a wider lateral spread than the deep p-body 930. In some implementations, the shallow p-body 932 is substantially similar to the first p-body region 630*a* described with reference to FIG. 6. In some implementations, a high angle and low energy implant beam is used for implanting the shallow p-body 932. The shallow p-body can 932 can be implanted using the same masking layer 929 that is used for masking of the implantation of the deep p-body 930, so that the shallow p-body and deep p-body are automatically aligned. The lower energy of the beam allows the shallow p-body 932 to be shallower than the deep p-body 930. The high angle of the beam with the vertical allows the shallow p-body 932 to have a larger lateral spread than the deep p-body 930. For example, the high angle beam can be used to extend the lateral spread of the shallow p-body 932 to regions under the masking layer 929. In some implementations, one end of the shallow p-body 932 extends to, e.g., abuts the oxide region 918 on the source side of the trench gate. In contrast, the low angle implantation of the deep p-body 930 results in the deep p-body 930 being spaced from the oxide of the trench. In some implementations, the dopant concentration of the shallow p-body 932 is higher than that of the deep p-body 930. It should be noted that the dopant concentration and/or angle and energy of an implant beam can be varied to obtain different depth, spread and concentration in the shallow and deep p-bodies.

Figure 9R:
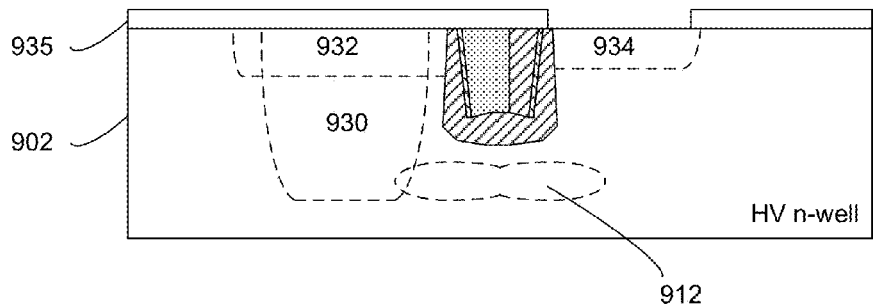

Referring again to FIG. 8, the process 800 also includes forming a drain region (step 860). In particular, a shallow, low n-doped region 934 can be formed on the drain-side of the trench. This is also schematically shown in FIG. 9R. Forming the shallow low n-doped drain region includes forming and patterning a masking layer 935 that exposes only the region where the drain 934 is formed. The shallow, low n-doped region can abut the drain-side of the trench, and can be shallower than the first p-body region 932. Typically, the masking layer 929 is removed prior to forming the masking layer 935. In some cases, the masking layer 929 can be modified to create the masking layer 935. The drain 934, which in some cases is the NDD 324 described with reference to FIG. 3, is implanted through the exposed portion of the masking layer 935.

Figure 9S:
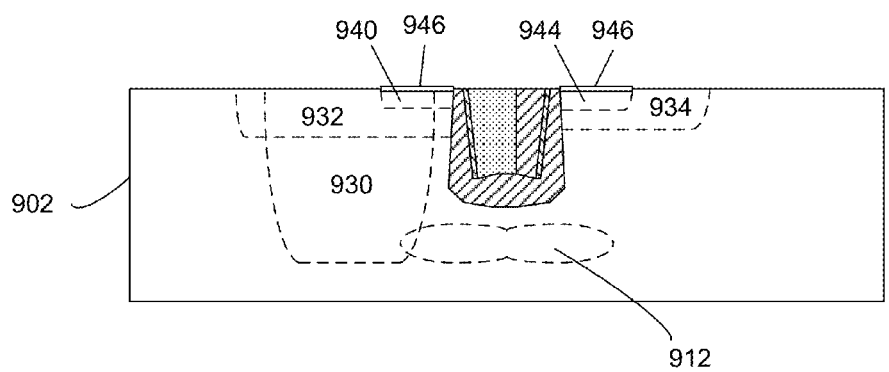
Figure 9T:
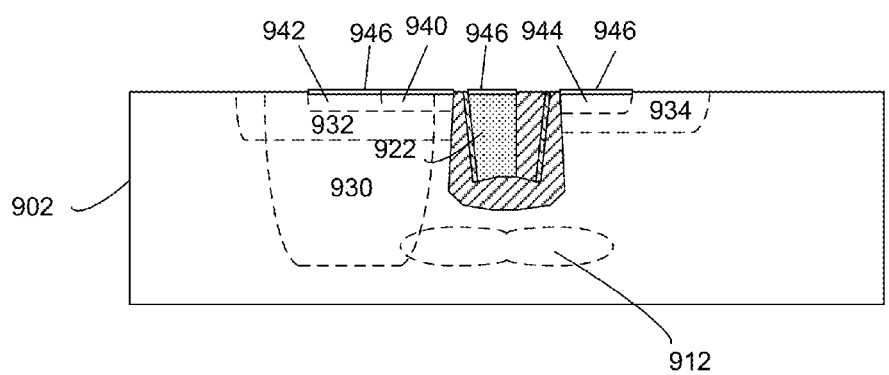

Referring again to FIG. 8, the process 800 further includes additional dopants (step 870) in the source and drain regions. This is described in details with reference to FIGS. 9S-9U. The additional dopants are implanted to form an n+ region 940 at the source and another n+ region 944 at the drain. The n+ regions 940, 944 can abut the trench, e.g., abut the oxide of the trench, on the source and drain sides, respectively. Forming the n+ regions 940, 944 typically includes forming an appropriate mask to expose the regions where the n+ dopants are to be implanted. The exposed regions are then implanted with n+ dopants to simultaneously form the n+ regions both at the source and the drain. In general, the n+ regions 940, 944 are highly doped (relative to the NDD 934), and provide low resistivity ohmic contacts for the vertical gate LDMOS transistor. In some implementations, a layer of silicide 946, such as a metallic silicide, is formed over the n+ regions 940, 944. Typically, the silicide layer 946 is formed to provide interconnection paths that possess low resistivities and the have the ability to withstand subsequent high temperature processes. The layer of silicide 946 can be formed using silicidation processes such as co-evaporation, sputter deposition or chemical vapor deposition. The mask used for implanting the n+ dopants at the source and drain is subsequently removed.

The source region is further implanted with p+ dopants to form the p+ region 942. The process of implanting the p+ dopant, which is described with reference to FIG. 9T, includes forming and patterning an appropriate mask that exposes the area at the source. The exposed region is then implanted with p+ dopants to form the p+ region 942. The p+ region 942 can abut the n+ region 940. This is followed by forming a layer of silicide 946 over the p+ region 942 and subsequently removing the mask. In some implementations, the p+ region 942 at the source can be formed before forming the n+ regions 940 and 944. In some implementations, a layer of silicide 946 is also formed over the polysilicon 922. This can be done by patterning the mask appropriately during silicidation of either the p+ region 942 or the n+ regions 940 and 944. In some cases, a separate mask can also be patterned to form the silicide layer 946 on the polysilicon 922.

Figure 9U:
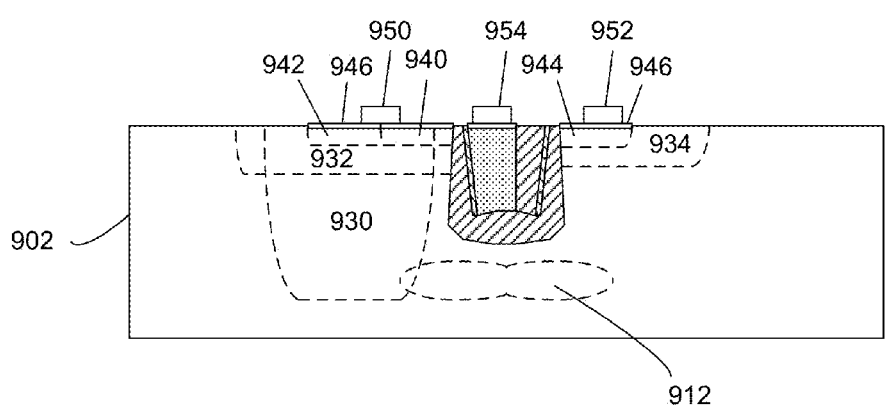

Referring now to FIG. 9U, formation of metallic contacts at the source, drain and gate is shown. A metallic contact 952 is formed over the silicide layer 946 at the drain. Similarly, metallic contacts 950 and 954 are formed over the silicide layers at the source and gate, respectively. In some implementations, forming the metallic contacts includes depositing a layer of oxide (not shown) and patterning the oxide to create recesses defining the sites of the metallic contacts. Metal is then deposited in the patterned oxide layer such that the recesses are filled with metal. The metal layer is subsequently planarized to remove the metal from everywhere except the recesses. The oxide layer is then removed to produce the metallic contacts as shown in FIG. 9U. The metallic contacts provide connections to the vertical gate LDMOS transistor from the interconnect wires.

Figure 10:
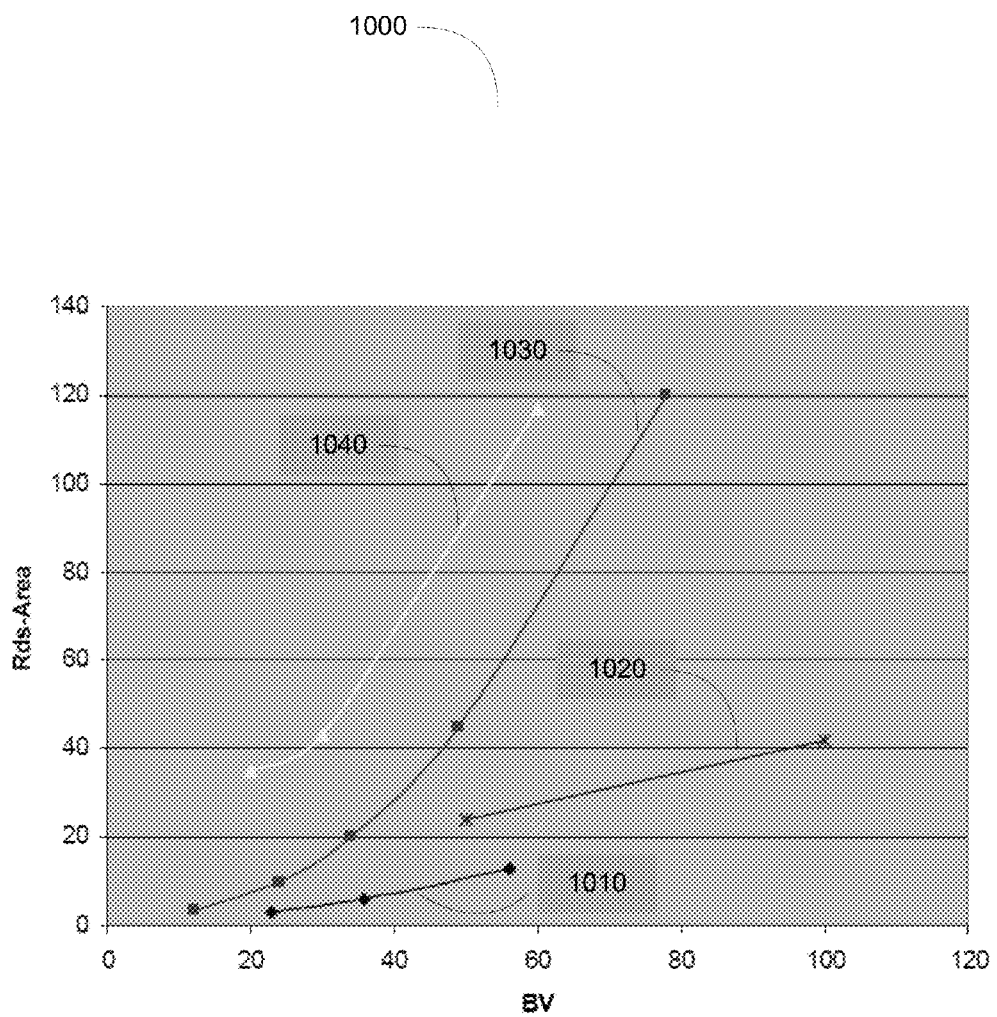
FIG. 10 is a graph comparing the performance of a vertical gate LDMOS transistor with other devices.

In general there is a trade-off between the breakdown voltage and the total resistance $R_{ds}$ between the source and drain. A higher breakdown voltage typically results in an increase in the $R_{ds}$. Referring now to FIG. 10, a plot 1000 shows experimental results related to the trade-off performance of the vertical gate LDMOS transistor as compared to other devices. The curve 1010 depicts experimental results for a vertical gate LDMOS transistor with a 5V drive voltage at the gate. The curve 1020 experimental results for a gallium nitride (GaN) transistor with a 5V drive voltage. Similarly, the curve 1030 and 1040 show experimental results for a bipolar CMOS DMOS device and a DirectFET® device (developed by International rectifier of El Segundo Calif.), respectively. From FIG. 10, it can be observed that for a given breakdown voltage (BV), the vertical gate LDMOS transistor exhibits the lowest $R_{ds}$ among the set of devices used in the experiment. Also, the rate of increase of $R_{ds}$ with the breakdown voltage is seen to be very low for the vertical gate LDMOS transistor. In some implementations, the breakdown voltage of the vertical gate LDMOS transistor is substantially between the range 10V-100V.

In general, the gate region of the vertical gate LDMOS transistors described herein are asymmetric gates that includes a region of conductive material (e.g. polysilicon) and a region of a dielectric material (e.g. an oxide). The asymmetric gate can be fabricated in various ways. Process flows in some exemplary methods of fabricating the asymmetric gate are discussed next.

Figure 11:
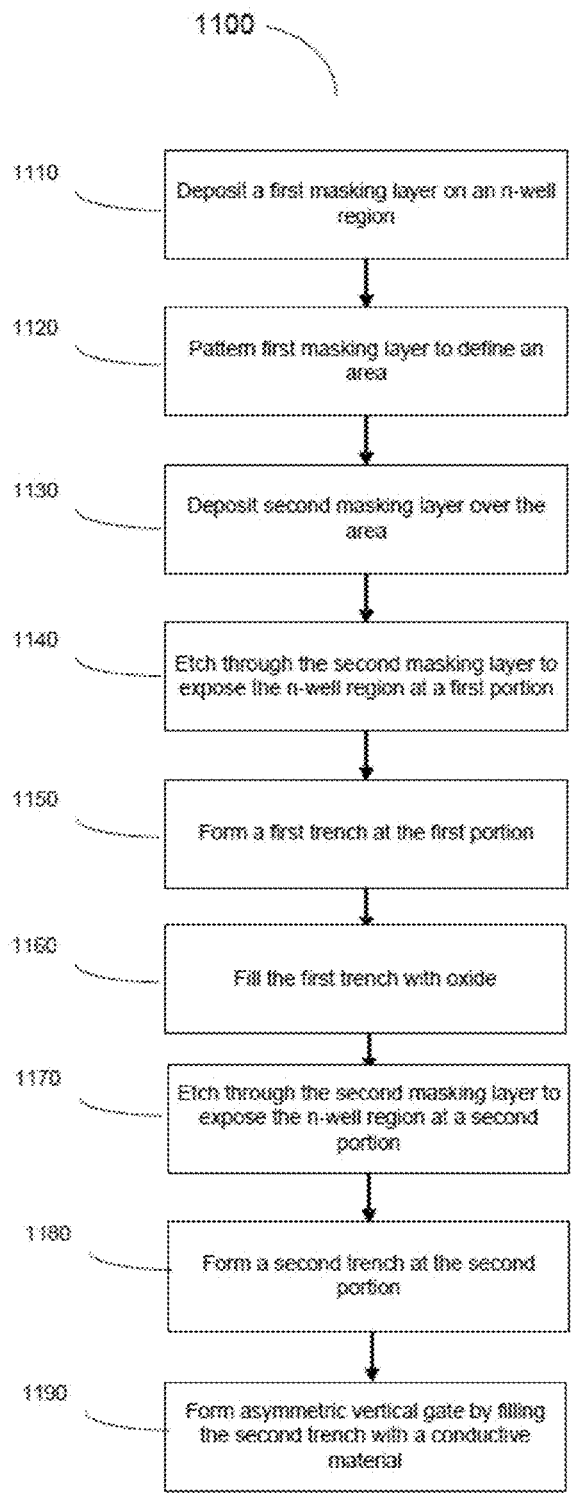
FIG. 11 is a flowchart showing exemplary fabrication steps for an asymmetric gate of a vertical gate LDMOS transistor.
Figure 12A:
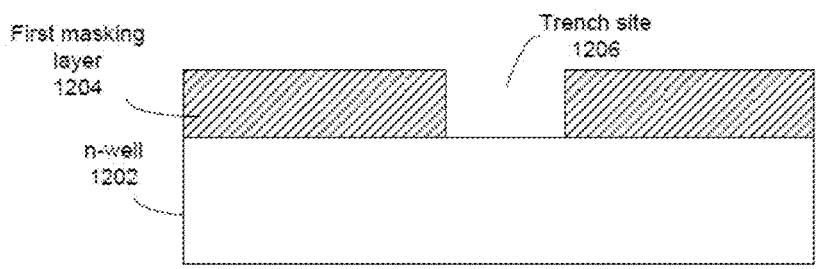
FIGS. 12A-12K are schematic cross-sectional views of an asymmetric gate of a vertical gate LDMOS transistor in various stages of an exemplary fabrication process.

Referring now to FIG. 11, a flow diagram represents exemplary steps of a process 1100 of fabricating the asymmetric gate of the vertical gate LDMOS transistor (e.g., the transistor 600). The process 1100 includes depositing a first masking layer on an n-well region (step 1110) of a semiconductor substrate, e.g., a silicon substrate. This step is schematically depicted in FIG. 12A, where a first masking layer 1204 is deposited on an n-well region 1202. The remainder of the substrate has been omitted from FIGS. 12A-12K for brevity. The substrate can be a p type substrate 302 as shown in FIG. 9A or an n-type substrate. The n-well region 1202 on which the first masking layer 1204 is deposited can be substantially similar to the n-well region 1202 described above with reference to FIG. 9A. In some implementations, the n-well region 1202 can be a high voltage n-type well HNW 303 as described with respect to FIG. 3.

The first masking layer 1204 can have various compositions. In some implementations, the first masking layer 1204 is composed of a conductive material such as polysilicon. In other implementations, the first masking layer can be composed of an oxide, nitride, or a photoresist material.

Referring back to FIG. 11, the process 1100 also includes pattering the first masking layer to define an area (step 1120) (or trench site 1206, as shown in FIG. 12A) in which the surface of the substrate and a portion of the underlying n-well region 1202 is exposed. The patterning can be done, for example, by depositing a photoresist material on the first masking layer 1204, patterning the photoresist material using photolithography techniques, and then etching the masking layer 904 using the photoresist as a mask.

Figure 12B:
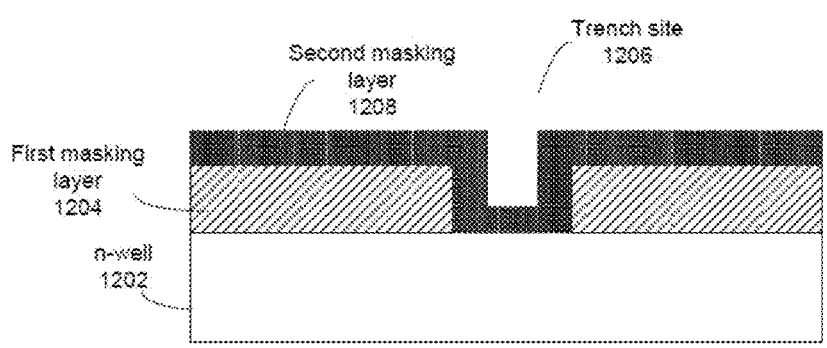

The process 1100 also includes depositing a second masking layer over the area or trench site 1206 (step 1130). This is schematically shown In FIG. 12B where a second masking layer 1208 is deposited over trench site 1206 and at least partially over the first masking layer 1204. In some implementations, the second masking layer 1208 is a nitride such as aluminum nitride or silicon nitride. In other cases, the second masking layer 1208 can be composed of a conductive material such as polysilicon or a dielectric material such as an oxide. The second masking layer 1208 is composed of a material different from the first masking layer 1204. The first and second layers can be deposited using various fabrication techniques, including, for example, chemical vapor deposition (CVD) and sputter deposition.

Figure 12C:
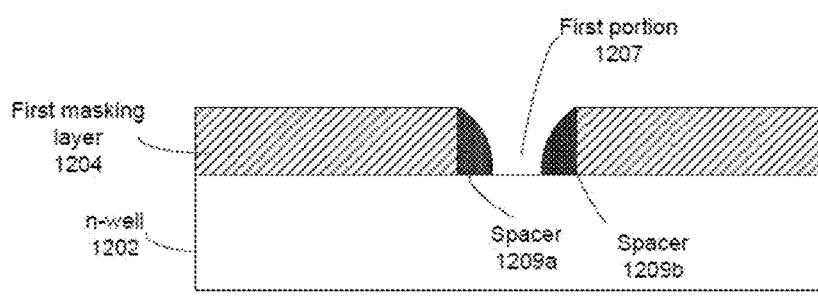

The process 1100 further includes etching through the second masking layer 1208 in a first portion 1207 of the trench site 1206 (step 1140). This is schematically shown in FIG. 12C. In the example of FIG. 12C, portions of the second masking layer 1208 are removed to expose a portion of the n-well region 1202 in the trench site 1206. In some implementations, portions of the second masking layer 1208 are removed using, for example, a dry etch process such as a Bosch process. The etching process is configured to preferentially etch away the second masking layer in a downward direction such that some portions of the second masking layer 1208 abutting the first masking layer in the trench site 1206 are left as residues. In general, the second masking layer 1208 is etched or otherwise removed in a way such that the second masking layer 1208 is not removed from portions abutting the first masking layer in the trench site 1206. These residual portions include a source side spacer 1209a and a drain side spacer 1209b (spacers 1209, in general). Etching removes the second masking layer 1208 to expose the top surface of the first masking layer 1204. Etching also removes portion of the second masking layer 1208 between the source side spacer 1209a and drain side spacer 1209b to expose the top surface of the n-well region 1202. The width of the spacers 1209 can be controlled, for example, by controlling the thickness of the second masking layer 1208. In some implementations, the spacers 1209 can allow formation of features that are narrower that the lithographic limits of the fabrication process.

Figure 12D:
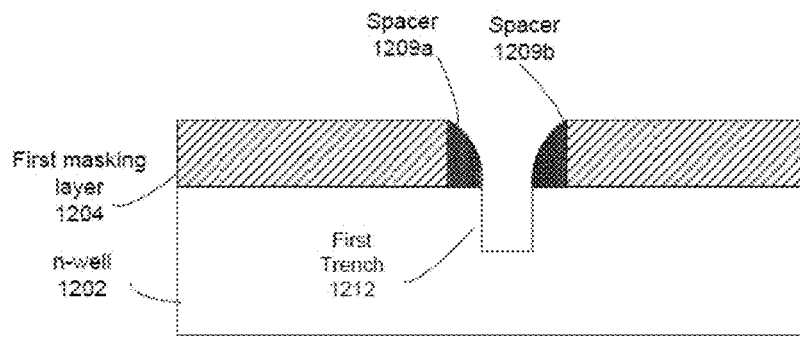

The process 1100 also includes forming a first trench in the exposed n-well region (step 1150). This is schematically shown in FIG. 12D which shows the first trench 1212 in the n-well region 1202. In some implementations, the first trench 1212 can be formed by etching out a portion of the n-well region 1202, at the trench site 1206. In some implementations, the etching can be done using a plasma etching process such as reactive ion etching or deep reactive ion etching. However, other etching processes, such as wet etching, can also be used. The spacers 1209 and the first masking layer 1204 are used as masks during the etching of the first trench 1212. Thus, the first trench 1212 is formed in the n-well region 1202 in a region between the two spacers 1209a, 1209b. The etching is done such that the first trench 1212 extends from the surface of the n-well region to a first depth in the n-well region. The first depth can be controlled based on a desired depth of the insulator, e.g., the oxide, in the asymmetric gate of the vertical gate LDMOS transistor. In some implementations, at least a portion of the p-body 630c (described above with reference to FIG. 6) can be formed after the first trench 1212 is formed. The procedure for forming the p-body can be substantially similar to the process described above with reference to FIGS. 9D-9E and FIGS. 9P-9Q. For example, forming the p-body can include first forming a p-type region 910 in the n-well as described with reference to FIG. 9D. A portion of the implanted region can then be neutralized by implanting an n-type material through the trench to form a p-body island 912 as described with reference to FIG. 9E. A deep p-body (such as the region 930 described with reference to FIG. 9P) and a shallow p-body (such as the region 932 described with reference to FIG. 9Q) can then be formed to complete the entire p-body that extends from the source region to the region below the trench and includes the p-body island.

Figure 12E:
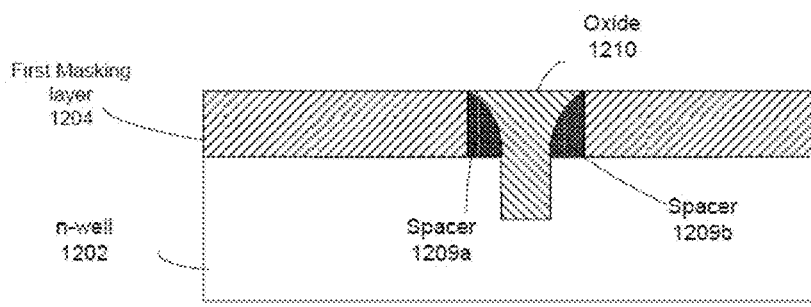

The process 1100 also includes filling the first trench with an oxide (step 1160). This is schematically shown in FIG. 12E where the first trench 1212 is filled with an oxide 1210. Filling the first trench 1212 with the oxide 1210 can include a deposition technique such as CVD and can be followed by a planarization process such as CMP, e.g., to remove any overlying oxide and expose the top surface of the first masking layer. The planarization process can be configured such that at least a portion of the spacers 1209 is intact.

Figure 12F:
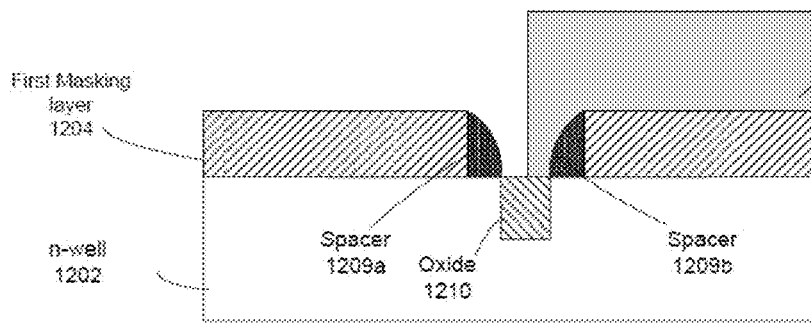
Figure 12G:
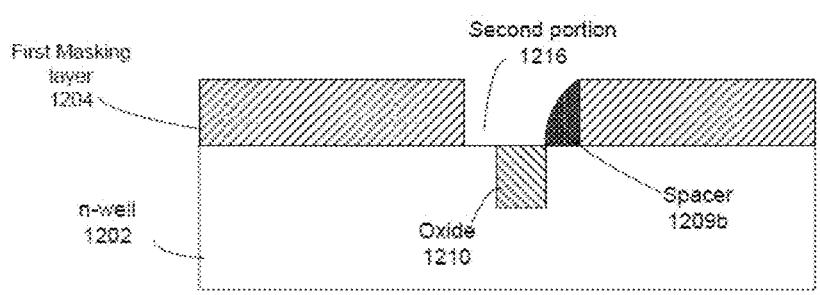

The process 1100 further includes etching through the second masking layer to expose the underlying n-well region 1202 in a second portion (step 1170) of the trench site 1206. This is schematically shown in FIGS. 12F-12G. Etching through the second masking layer, in this example, is substantially equivalent to etching away the source side spacer 1209a and can include etching through at least a portion of the oxide 1210 to expose the spacers 1209. Because the second portion 1216 of the trench site 1206 lies beneath the source side spacer 1209a, any other portions of the second masking layer 1208, including the drain side spacer 1209b has to be masked before etching the second masking layer to expose the second portion 1216 of the trench site 1206. This can be done, for example, by using a mask (for example, a mask of standard photoresist) 1215, as shown in FIG. 12F, to protect one of the spacers 1209 from the etching process. In this example, one edge of the mask 1215 lies between the source side spacer 1209a and the drain side spacer 1209b. The mask 1215 typically covers the first masking layer 1204 on the drain side and the drain side spacer 1209b. In such cases, various positions of the mask 1215 may be possible as long as the mask 1215 covers one spacer and exposes the other. The exposed spacer (1209a, in this example) can then be etched out thereby exposing the n-well region 1202 at second portion 1216 of the trench site 1206 as shown in FIG. 12G.

Figure 12H:
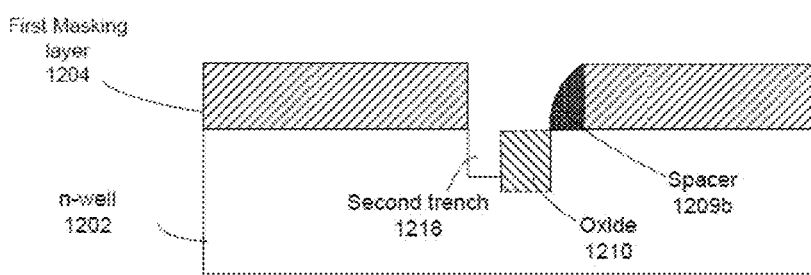

The process 1100 also includes forming a second trench in the n-well region at the exposed second portion (step 1180). This is schematically shown in FIG. 12H. The second trench 1218 can be etched in the n-well region 1202 substantially similarly to the process used for forming the first trench 1212. The second trench extends from the surface of the n-well region 1202 to a second depth into the n-well region 1202. In some implementation, the second depth is less than the first depth associated with the first trench 1212. The process 1100 allows for controlling the depth of the first trench (which is filled with the oxide 1210) and the second trench (which is filled with a conducting portion 1225) separately thereby facilitating a high degree of control over the structure of the asymmetric gate. In some implementations, instead of or in addition to implantation after the formation of the first trench as shown in FIG. 12D, at least a portion of the p-body 630c (described above with reference to FIG. 6) can be formed after the second trench 1218 is formed. The procedure for forming the p-body can be substantially similar to the process described above with reference to FIGS. 9D and 9E.

Figure 12I:
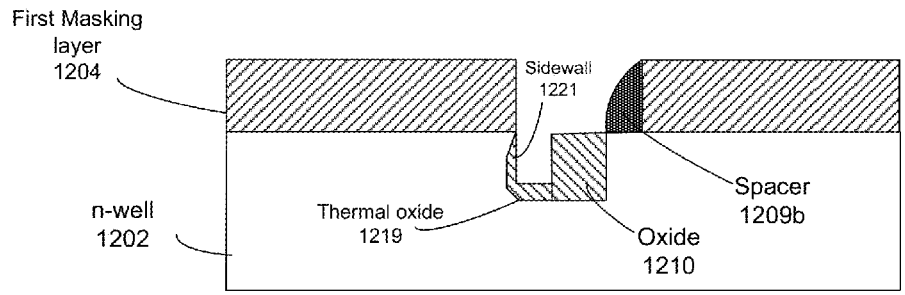

Referring now to FIG. 12I, after the second trench 1218 is formed, a layer of thermal oxide 1219 can be formed at the bottom of the second trench 1218 as a boundary between the second trench 1218 and the n-well region 1202, i.e., on the source side of the second trench. The thermal oxide layer 1219 can also extend to the region adjacent to the sidewall 1221 of the second trench 1218 that abuts the n-well region 1202. Typically the thickness of the thermal oxide layer 1219 near the bottom of the second trench 1218 is more than the thickness near the sidewall. In some implementations, the thickness of the thermal oxide 1219 at the bottom of the second trench 1218 can be made more than the thickness near the sidewall 1221 by forming a masking layer on the sidewall 1221 prior to the thermal oxidation. For example, a nitride layer can be formed on the sidewall 1221 and not at the bottom of the second trench 1218, for example, by an anisotropic etch that strips the nitride from the bottom but not the sidewalls 1221. The nitride layer inhibits oxidation of the sidewall, such that the oxidation of the bottom of the trench is thicker than the oxidation near the sidewall 1221. Even though the example of FIG. 12I illustrates the thickness of the thermal oxide 1219 near the bottom of the second trench 1218 to be aligned with the depth of the oxide 1210, the depth of the oxide 1210 can be more or less than that of the thermal oxide 1219.

Figure 12J:
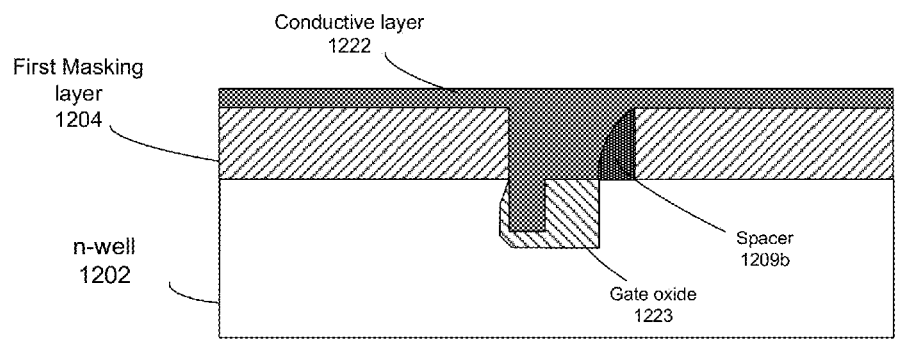
Figure 12K:
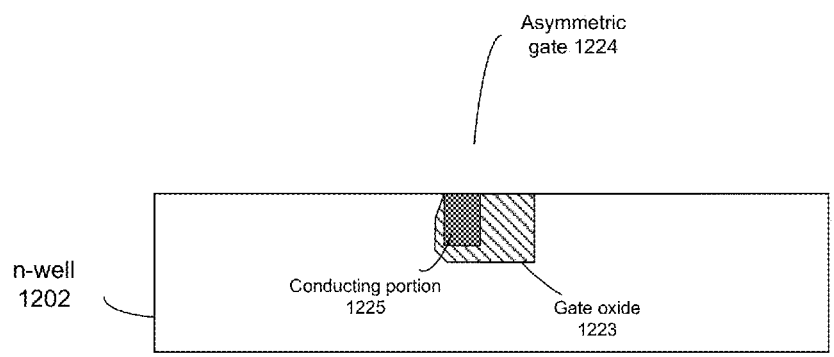

The process 1100 can also include forming an asymmetric vertical gate by filling the second trench with a conductive material (step 1190). In some implementations, the masking layer (e.g. nitride) formed on the sidewall 1221 may be removed (for example, by an etching process) before the second trench is filled with the conductive material. Formation of the asymmetric gate 1224 is schematically illustrated in FIGS. 12J-12K. As shown in FIG. 12J, the second trench is filled with a conductive layer 1222. In some implementations, the second trench is filled with the conductive material using processes such as electrochemical deposition (ECD) or physical vapor deposition (PVD). However, other methods to deposit conductive materials can also be used. The thermal oxide 1219 and the oxide 1210 together form the gate oxide 1223. In some implementations, the conductive layer 1222 is polysilicon.

Formation of the asymmetric gate 1224 also includes removal of the first masking layer 1204, the source side spacer 1209a as well as portions of the conductive layer 1222 that extends above the top surface of the substrate in the n-well region 1202. This can be done, for example using a planarization process such as CMP. The planarization can be performed until the top surface of the n-well region 1202 is exposed. After removal of the above portions, the asymmetric gate 1224, that includes the gate oxide 1223 and the conducting portion 1225, is formed. It should be noted that another dielectric material can be used in place of the gate oxide 1223. The gate oxide 1223 and the conducting portion 1225 can be substantially similar to the dielectric 415 and conducting portion 410 described above with reference to FIG. 4.

Figure 13:
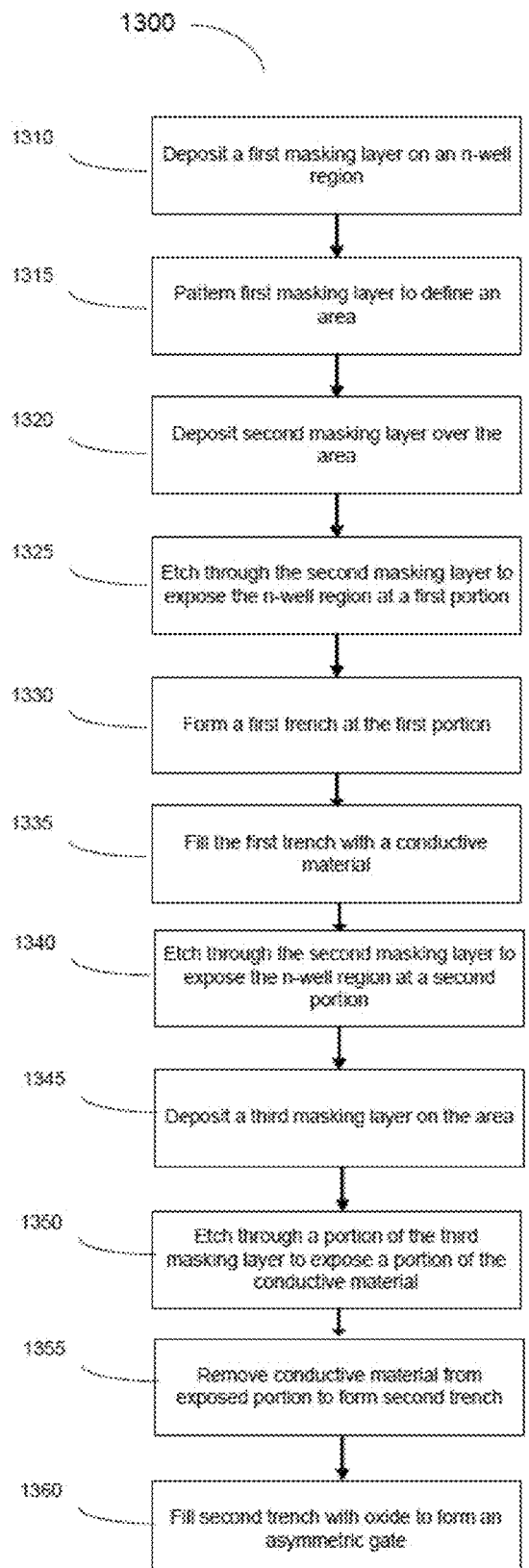
FIG. 13 is a flowchart showing exemplary fabrication steps for an asymmetric gate of a vertical gate LDMOS transistor.
Figure 14A:
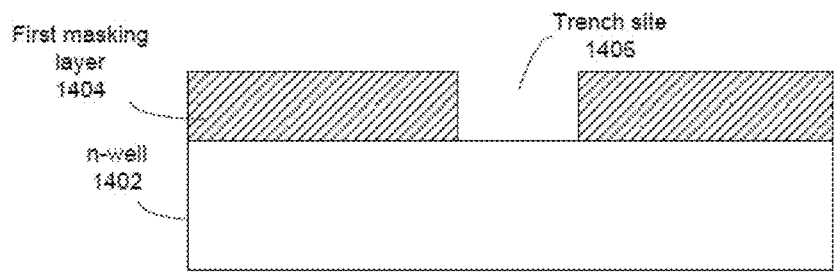
FIG. 14A-14L are schematic cross-sectional views of an asymmetric gate of a vertical gate LDMOS transistor in various stages of an exemplary fabrication process.

Referring now to FIG. 13, a flow diagram represents exemplary steps of another process 1300 of fabricating the asymmetric gate of the vertical gate LDMOS transistor (e.g., the transistor 600). The process 1300 includes depositing a first masking layer on an n-well region (step 1310) on a silicon substrate. The process also includes patterning the first masking layer to define an area (step 1315). These steps are schematically shown in FIG. 14A where a first masking layer 1404 is deposited on an n-well region 1402. Please note that the substrate has been omitted from FIGS. 14A-14L for brevity. The area defined in step 1315 can be referred to as a trench site 1406. In some implementations, the steps 1310 and 1315 can be substantially similar to the steps 1110 and 1120, respectively described above with reference to FIG. 11. In some implementations, the first masking layer 1404 can be composed of an oxide. Alternatively, the first masking layer 1404 can be composed of a nitride such as silicon nitride.

Figure 14B:
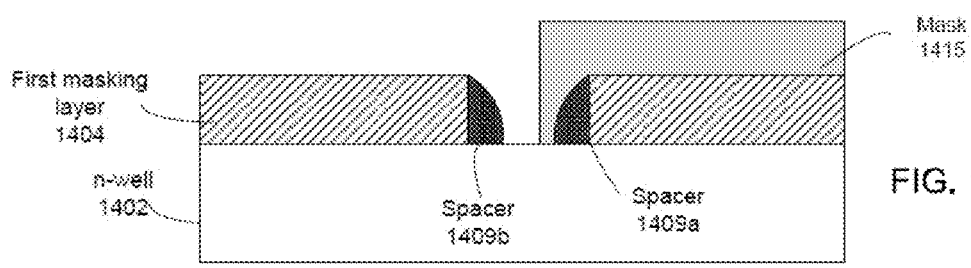
Figure 14C:
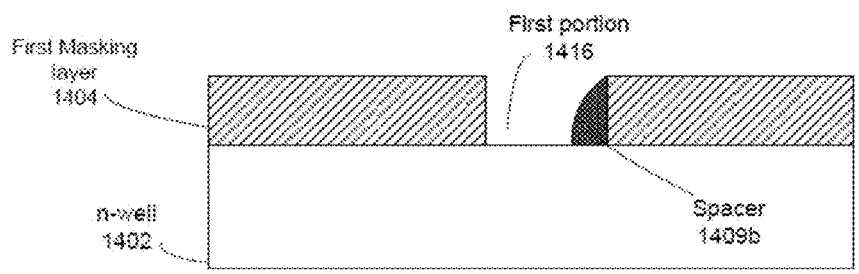

The process 1300 also includes depositing a second masking layer over the area or trench site 1406 (step 1320) and etching through the second masking layer to expose the n-well region at a first portion (step 1325). These steps are schematically shown In FIGS. 14B and 14C. The second masking layer is different from the first masking layer. For example, if the first masking layer 1404 is an oxide, the second masking layer can be a nitride such as aluminum nitride or silicon nitride. As another example, if the first masking layer 1404 is a nitride, the second masking layer can be an oxide. The step of laying the second masking layer can be substantially similar to the step 1130 described above with reference to FIG. 11 and FIG. 12B. Exposing the n-well region 1402 in the first portion 1416 can include forming a source side spacer 1409a and the drain side spacer 1409b (spacers 1409, in general) of the second masking layer and etching out a spacer to expose the first portion 1416. Forming the source side spacer 1409a and the drain side spacer 1409b and etching the source side spacer 1409a can be carried out substantially similarly to as described with reference to FIGS. 12C and 12F, respectively. Because the first portion 1416 lies beneath the source side spacers 1409a, the drain side spacer 1409b has to be masked before the etching. This can be done, for example, by using a mask 1415, as shown in FIG. 14B, to protect the drain side spacer 1409b from the etching process. In some implementations, the mask 1415 is substantially similar to the mask 1215 described above with reference to FIG. 12F.

Figure 14D:
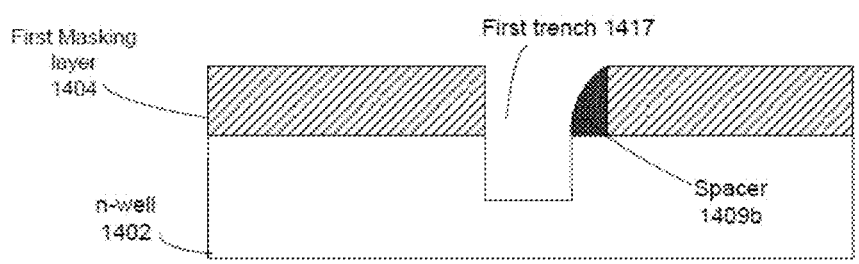

The process 1300 also includes forming a first trench in the exposed n-well region at the first portion of the trench site (step 1330). This is schematically shown in FIG. 14D which shows the first trench 1417 in the n-well region 1402. Formation of the first trench 1417 can be can be carried out substantially similarly to as described above with reference to FIG. 12D. In this example, the first trench 1417 spans the width of the trench site 1406 except the portion beneath the drain side spacer 1409b, as shown in FIG. 14D.

Figure 14E:
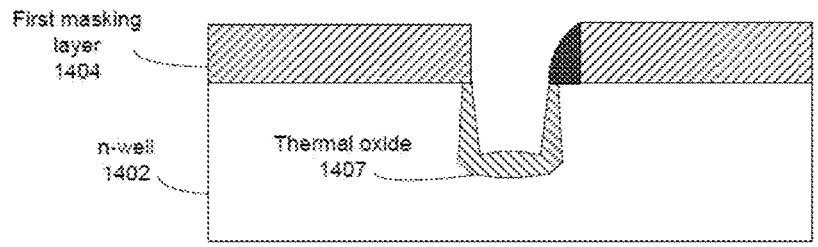

Referring now to FIG. 14E, after formation of the first trench 1417, a layer of thermal oxide 1407 can be formed around the first trench 1417. The thermal oxide 1407 acts as a boundary between the first trench 1417 and the n-well region 1402. Typically the thickness of the thermal oxide layer 1407 near the bottom of the first trench 1417 is more than the thickness near the sidewalls. In some implementations, the thickness of the thermal oxide 1407 at the bottom of the first trench 1417 can be made more than the thickness near the sidewalls by forming a masking layer on the sidewalls prior to the thermal oxidation. For example, a nitride layer can be formed on the sidewall 1221 (and not at the bottom of the second trench 1218) such that the oxidation of the bottom of the trench is more than the oxidation near the sidewalls. In some implementations, at least a portion of the p-body 630c (described above with reference to FIG. 6) can be formed after the first trench 1417 is formed. The procedure for forming the p-body can be substantially similar to the process described above with reference to FIGS. 9D and 9E.

Figure 14F:
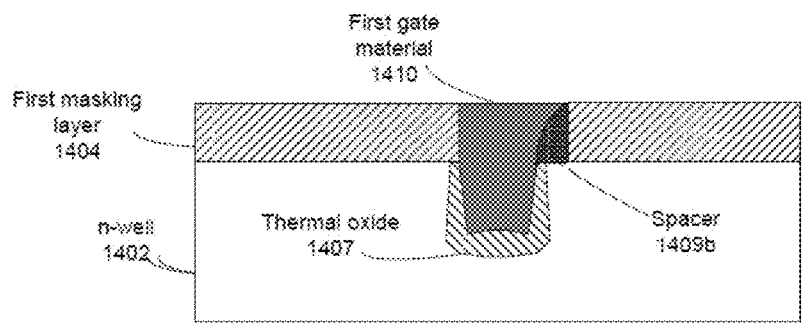
Figure 14G:
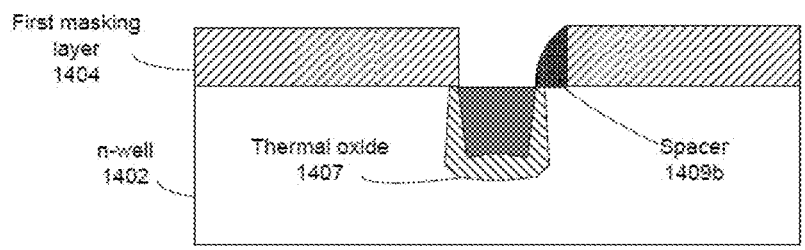

The process 1300 also includes filling the first trench with a first gate material (step 1335). The asymmetric gates described herein are typically composed of a conductive material and a dielectric material. Accordingly, in some implementations, the first gate material is a conductive material such as polysilicon. Alternatively the first gate material can be a dielectric material such as an oxide. This is schematically shown in FIGS. 14F and 14G. In some implementations, processes such as ECD or PVD can be used to fill the first trench with the first gate material 1410. However, other methods to deposit the first gate material 1410 can also be used. As shown in FIG. 14G, at least a portion of the deposited first gate material 1410 is etched away to expose a portion of the second masking layer, for example, the drain side spacer 1409b.

Figure 14H:
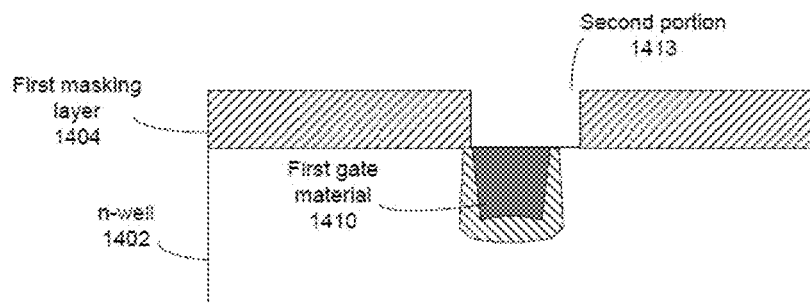

The process 1300 further includes etching through the second masking layer to expose the underlying n-well region 1202 in a second portion (step 1340) of the trench site 1406. This is schematically shown in FIG. 14H. In some implementations, the second portion 1413 is substantially non-overlapping with the first portion 1416. Etching through the second masking layer, can include etching through the drain side spacer 1409b.

Figure 14I:
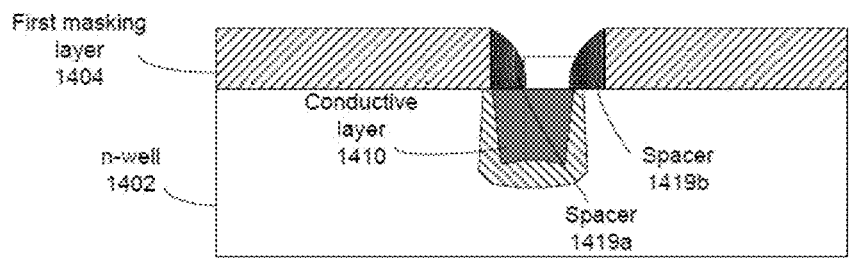

The process 1300 also includes depositing a third masking layer over the area or trench site 1406 (step 1345) and etching through a portion of the third masking layer to expose the first gate material at the first portion (step 1350). These steps are schematically shown In FIGS. 14I-14I In some implementations, the third masking layer can be composed of substantially that same material as the second masking layer. The step of depositing the third masking layer can be substantially similar to the step 1130 described above with reference to FIG. 11 and FIG. 12B. Exposing the first gate material 1410 can include etching out the third masking layer in a way such that another source side spacer 1419a and another drain side spacer 1419b (spacers 1419, in general) of the third masking layer are formed on either side of the exposed region of the first gate material 1410. In some implementations, the etching process employed can be substantially similar to the process described above with reference to FIG. 14B.

Figure 14J:
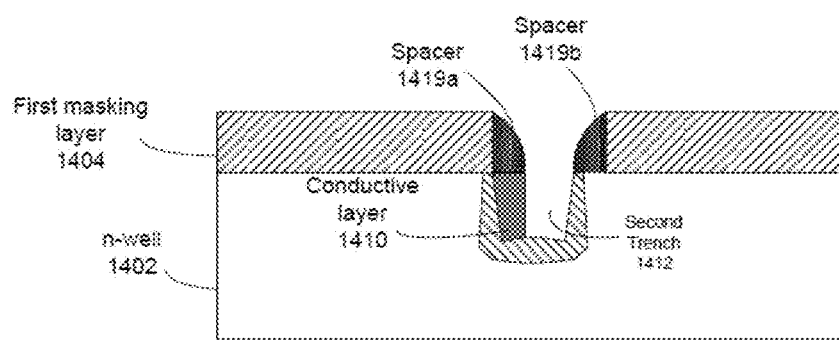

The process 1300 also includes removing a portion of the first gate material 1410 from the exposed portion to form a second trench (step 1355). This is schematically shown in FIG. 14J. The second trench 1412 can be formed, for example, by an etching process to remove the first gate material. The spacers 1419 act as masks in the etching process and can be used in determining the dimension of the second trench 1412. The second trench 1412 is therefore formed between the source and drain side spacers 1419. In some implementations, the spacers 1419 can allow the second trench to be narrower that the lithographic limits of the fabrication process.

Figure 14K:
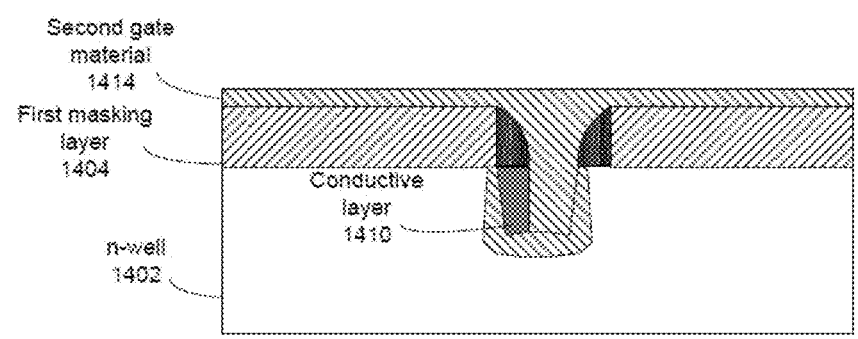
Figure 14L:
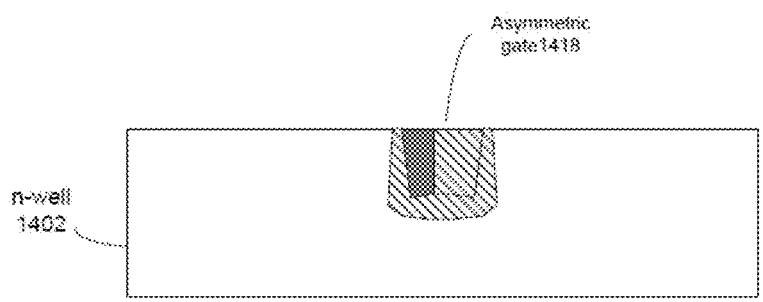

The process 1300 further includes filling the second trench with a second gate material (step 1160) to form an asymmetric gate. The second gate material is different from the first gate material. For example, if the first gate material is a conductive material, the second gate material is a dielectric such as an oxide. In another example, if the first gate material is a dielectric, the second gate material is a conductive material such as polysilicon. This is schematically shown in FIGS. 14K-14L. As shown in FIG. 14K, filling the second trench 1412 with the second gate material 1414 can include depositing a layer of the second gate material 1414, for example, using a deposition technique such as CVD. Deposition of the second gate material layer 1414 can be followed by a planarization process such as CMP to produce the asymmetric gate 1418, as illustrated in FIG. 14L.

Figure 15:
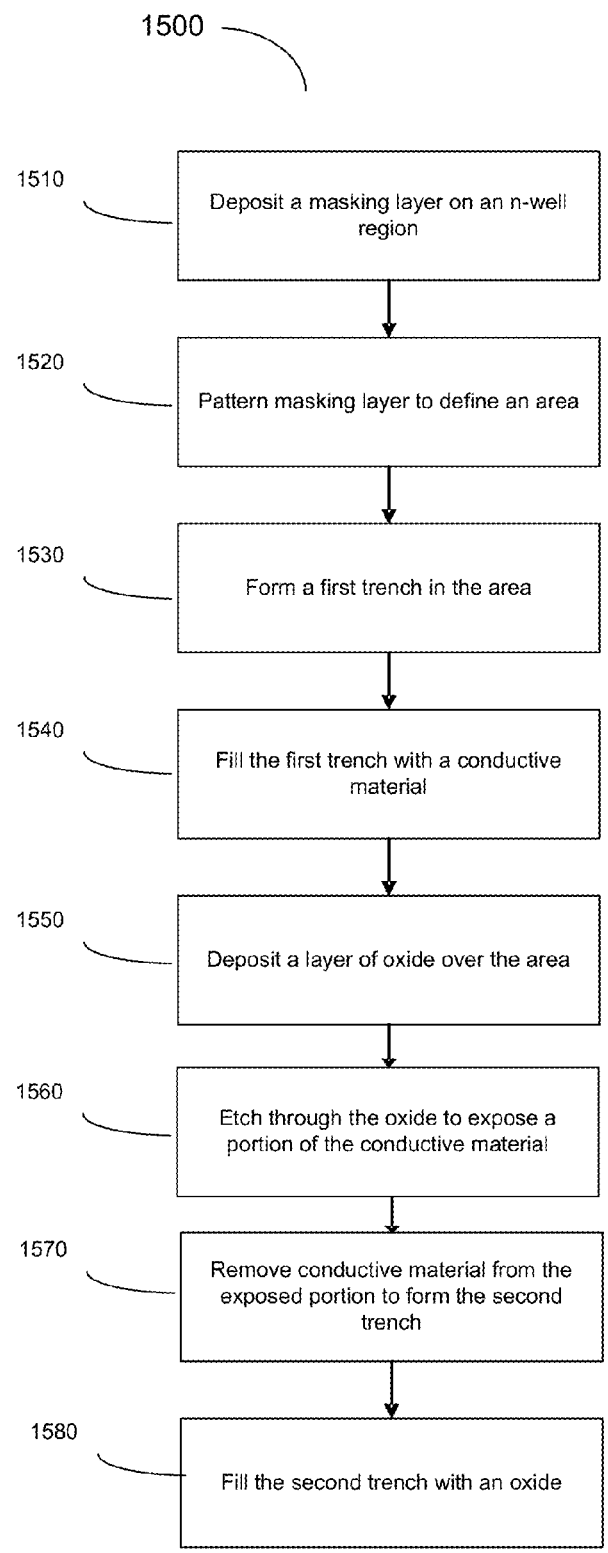
FIG. 15 is a flowchart showing exemplary fabrication steps for an asymmetric gate of a vertical gate LDMOS transistor.

Referring now to FIG. 15, a flow diagram represents exemplary steps of another process 1500 of fabricating the asymmetric gate of the vertical gate LDMOS transistor (e.g., the transistor 600). The process 1500 includes depositing a masking layer on an n-well region (step 1510) on a silicon substrate. The process also includes patterning the masking layer to define an area (step 1520). These steps are schematically shown in FIG. 14A where a masking layer 1604 is deposited on an n-well region 1602 and patterned to define the area denoted as the trench site 1606. The substrate has been omitted from FIGS. 14A-14L for brevity. In some implementations, the steps 1510 and 1520 are substantially similar to the steps 1110 and 1120, respectively described above with reference to FIG. 11. In some implementations, the masking layer can be composed of a nitride.

Figure 16A:
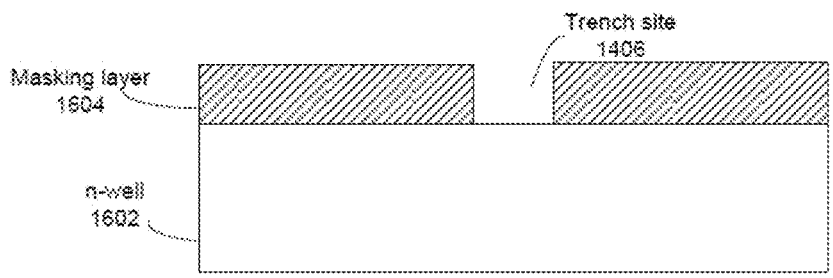
FIGS. 16A-16K are schematic cross-sectional views of an asymmetric gate of a vertical gate LDMOS transistor in various stages of an exemplary fabrication process.
Figure 16B:
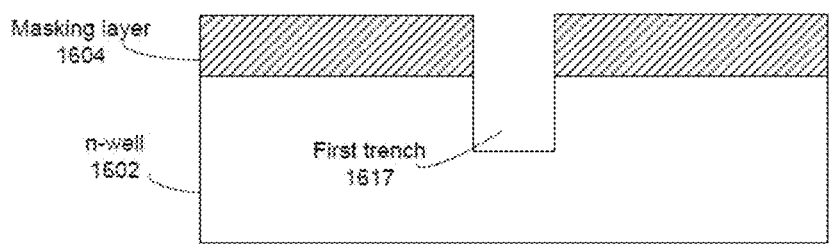

The process 1500 also includes forming a first trench in the area or trench site (step 1530). This step is schematically shown in FIG. 16B and can be substantially similar to the step 1150 described above with reference to FIG. 11. In some implementations, at least a portion of the p-body 630c (described above with reference to FIG. 6) can be formed after the first trench 1617 is formed. The procedure for forming the p-body can be substantially similar to the process described above with reference to FIGS. 9D and 9E.

Figure 16C:
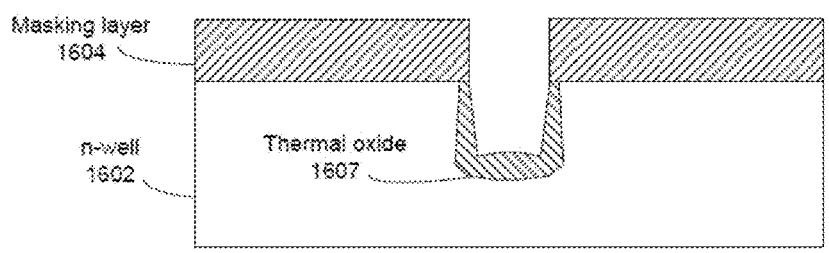
Figure 16D:
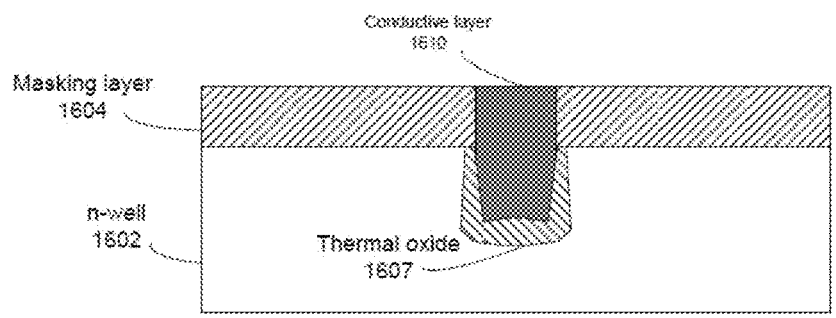
Figure 16E:
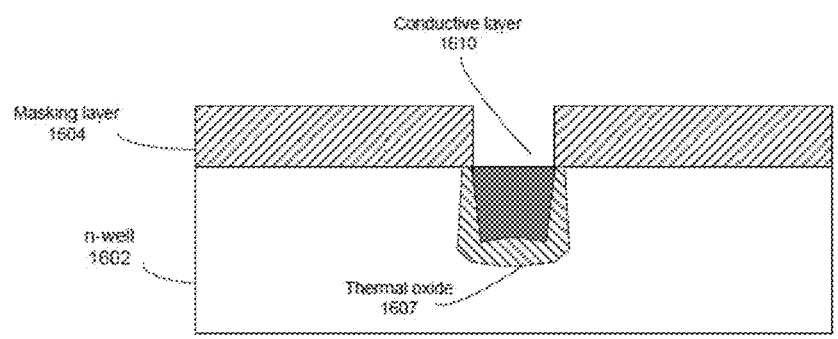

As shown in FIG. 16C, a layer of thermal oxide 1607 can be formed around the first trench 1617 substantially similarly as described above with reference to FIG. 14E. Subsequently, the trench is filled with a conductive material (step 1540). This is schematically shown in FIGS. 16D and 16E and can be done, for example, as described with reference to FIG. 14F. Filling the first trench 1617 with the conductive material 1610 can include a deposition step followed by planarization. As shown in FIG. 16E, at least a portion of the deposited conductive layer 1610 is etched away. In some implementations, the depth of the etched portion is substantially equal to the thickness of the masking layer 1604.

Figure 16F:
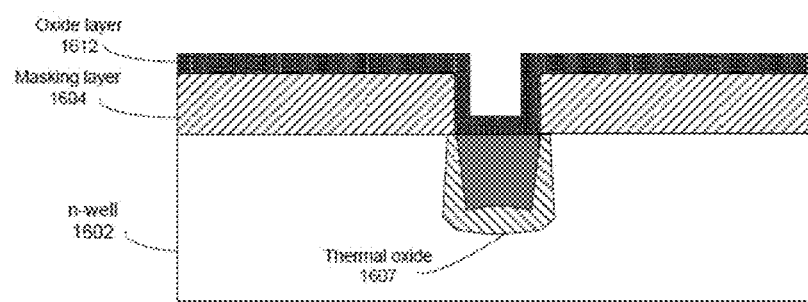
Figure 16G:
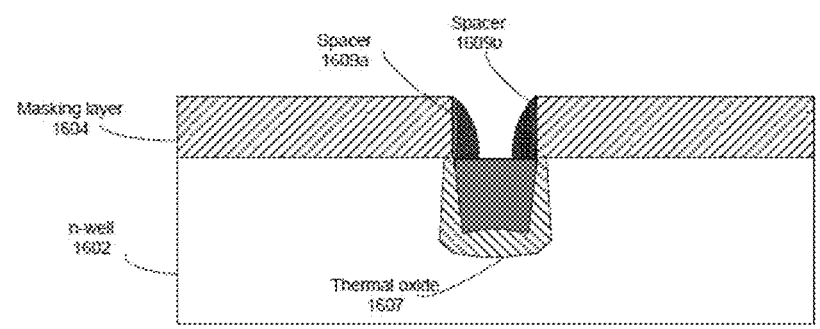
Figure 16H:
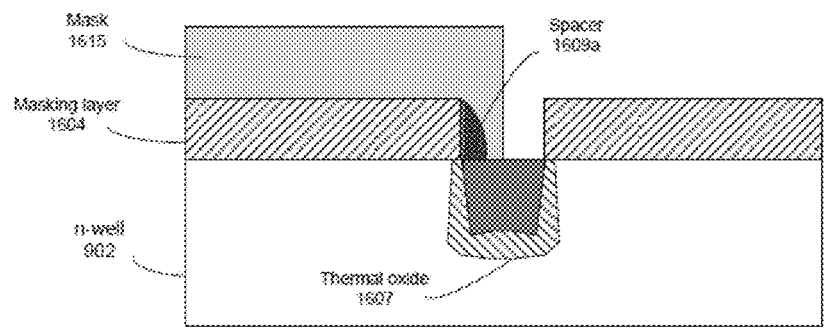

The process 1500 further includes depositing a layer of oxide over the area (step 1550). This is schematically shown in FIG. 16F where an oxide layer 1612 is deposited over the first masking layer as well as the conductive layer 1610. The process 1500 further includes etching through the oxide layer 1612 to expose a portion of the conductive layer 1610 (step 1560). This is schematically shown in FIGS. 16G and 16H. In the example of FIG. 16G, portions of the oxide layer 1612 are removed to expose a portion of the conductive layer 1610 in a way such that residual source and drain side spacers 1609a, 1609b (1609, in general) are formed. In some implementations, portions of the oxide layer 1612 are removed using, for example, a buffered hydrofluoric acid (HF) solution in a wet etch process. However other processes such as plasma etching can also be used. As shown in FIG. 16H, exposing the portion of the conductive layer 1610 can further include removing one of the spacers 1609 by masking the other substantially as described above with reference to FIG. 12F. In some implementations, the mask 1615 used for this process can be composed of photoresist or other blocking material.

Figure 16I:
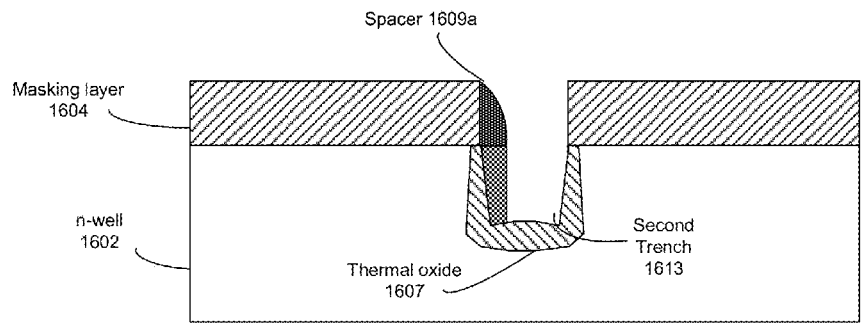
Figure 16J:
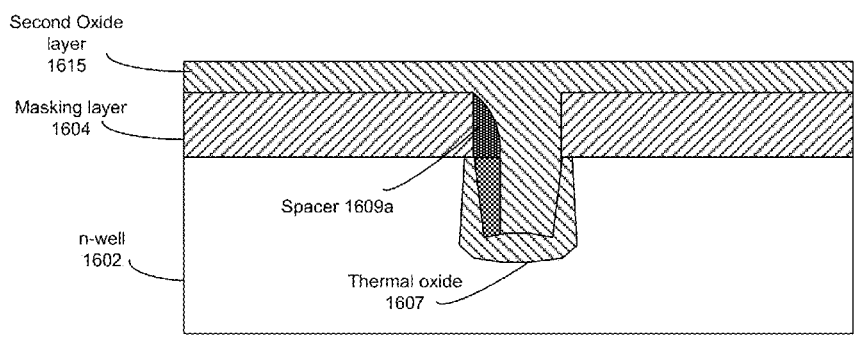
Figure 16K:
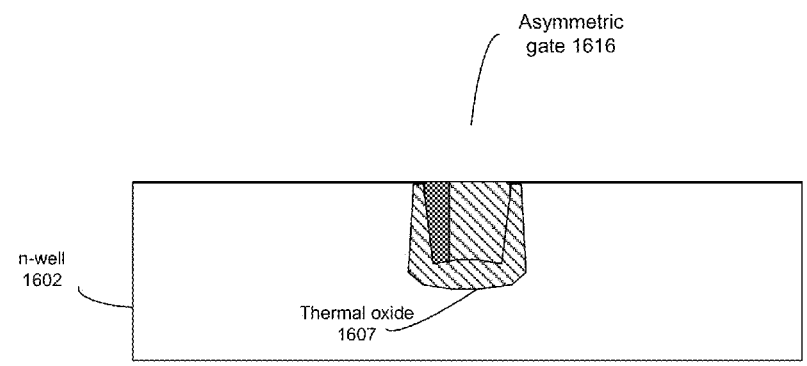

The process 1500 further includes removing the conductive material from the exposed portion to form a second trench (step 1570). This is schematically shown with reference to FIG. 16I where the second trench 1613 is formed by removing a portion the conductive layer 1610. In some implementations, removal of the conductive layer can be done substantially as described with reference to FIG. 14J. The process 1500 also includes filling the second trench with an oxide (step 1580). This is schematically shown in FIGS. 16J and 16K and in some implementations can be done substantially as described with reference to FIGS. 14K and 14L.

Figures 17A, 17B:
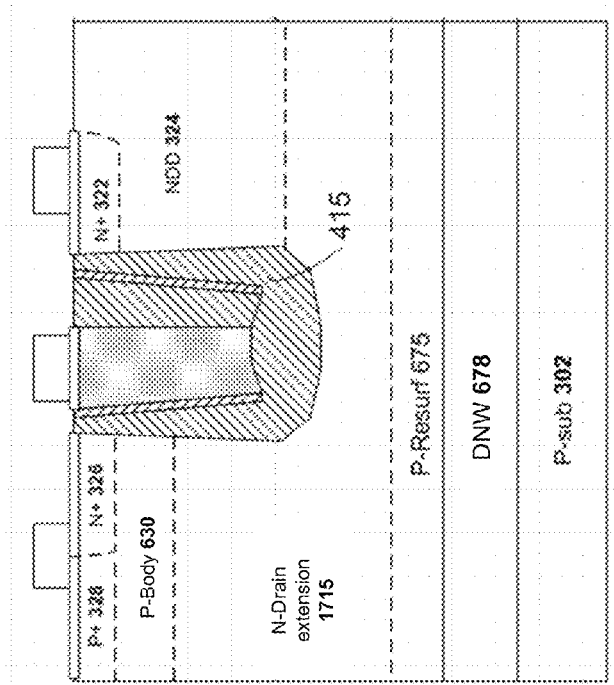
FIGS. 17A-17B are schematic cross sectional views of example vertical gate LDMOS transistors in a buck converter.

FIGS. 17A and 17B illustrate examples of a low side transistor 42 and a high side transistor 40, respectively, as used in a buck converter such as the ones shown in FIGS. 1 and 2. In some implementation, the high side transistor 40 (FIG. 17B) may need to be isolated whereas the low side transistor 42 (FIG. 17A) may be implemented as a simpler structure. In the example shown in FIG. 17A, the low side transistor 42 is implemented as a simple structure with a p-resurf layer 675 over the substrate 302. The p-resurf layer 675 typically has a lower dopant concentration than the p-body. The region between the p-body 630 and the p-resurf 675 is implemented as an extension 1715 of the NDD region 324. In the example, shown in FIG. 17A, the potential of the p-body 630 is substantially same as the potential of the substrate 302. The high side transistor 40 (FIG. 17B) however may require isolation and therefore includes a DNW 678 between the p-resurf 675 and the substrate 302. This allows the p-body 630 to be at a different potential from the substrate 302. In some implementations the p-resurf 675 of FIGS. 17A and 17B may be connected to the p-body 630, for example, as shown in FIG. 6E.

Other structures for the low side transistor 42 and the high side transistor 40 are also possible. In some implementations, various combinations of the example structures depicted in FIGS. 6A-6E can be used. For example, a simple structure such as the one illustrated in FIG. 6B can be used for the low side transistor 42 whereas any of the structures illustrated in FIG. 6A and FIGS. 6C-6E can be used for the high side transistor 40. In some implementations, the structures illustrated in FIG. 6A and FIGS. 6C-6E can be also used for the low side transistor 42.

Further modifications to the structure of the transistors are also possible. Examples of such modifications are illustrated in FIGS. 18A and 18B, which depict a low side transistor 42 and a high side transistor 40, respectively. In the examples of FIGS. 18A and 18B, an additional p-clamp region 1815 is provided at the interface of the p-resurf 675 and the n-drain extension 1715. The p-clamp region 1815 has a higher doping concentration that the p-resurf 675. The p-clamp region 1815 can be located on the drain side of the transistor, e.g., vertically below the NDD 324. The p doped p-clamp region 1815 can be used to move the location of the break-down region away from the current path between the drain and the source. The p-clamp region 1815 can be used to cause the breakdown in a region between the NDD region 324 and the p-resurf 675. In some implementations, this can improve a long term stability of the transistors during device operations.

Figure 19:
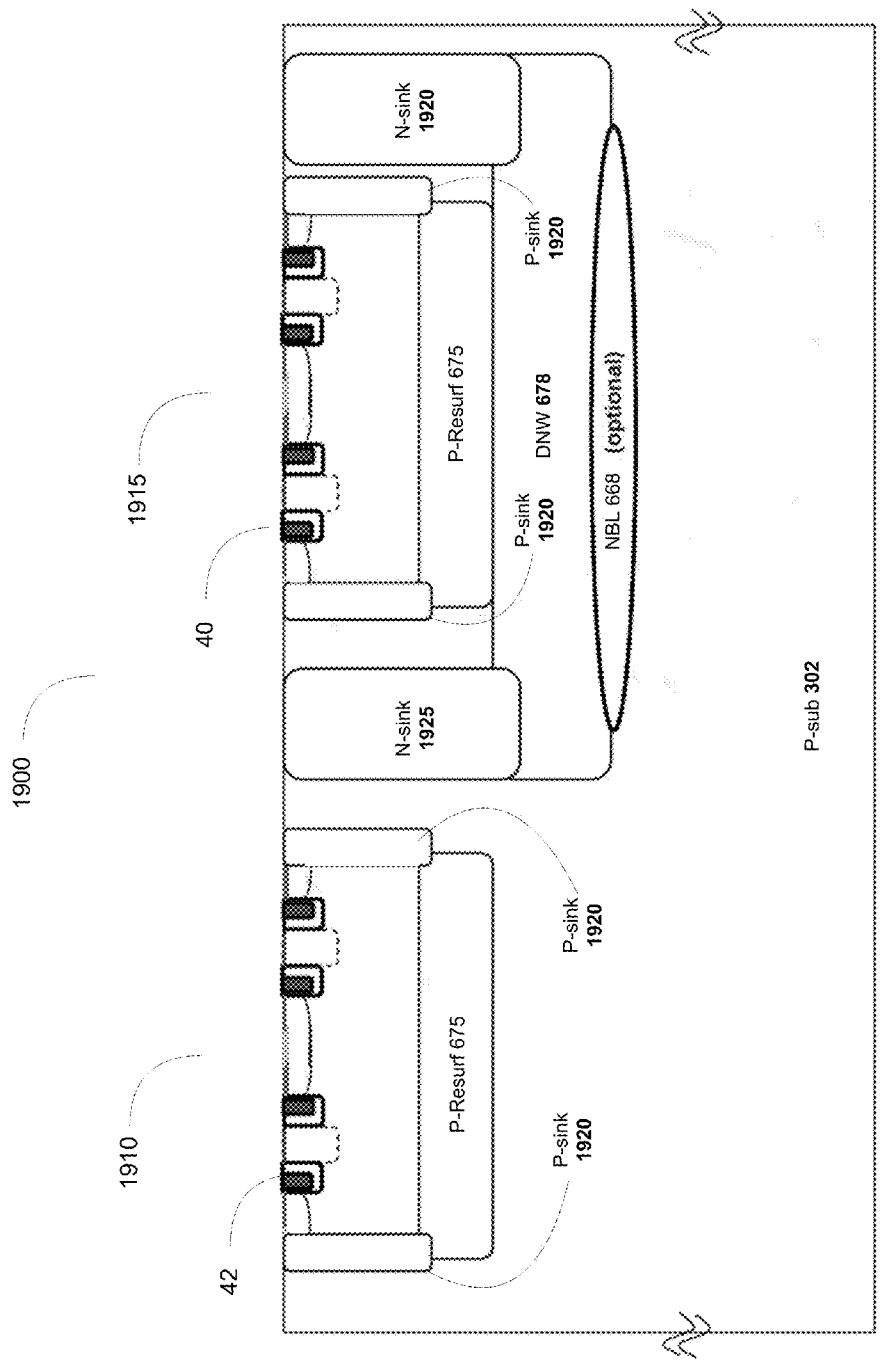
FIG. 19 is a schematic cross sectional view of an example of a buck converter.

In some implementations, a device can have more than one low side transistors 42 in a low side region and more than one high side transistors 40 in a high side region. In such cases, a plurality of the high side transistors may be isolated together. FIG. 19 illustrates an example of such a device 1900 that includes a low side region 1910 and a high side region 1915. In this example, the low side region 1910, which is surrounded by p-sink layers 1920 on the sides, is not isolated from the substrate 302. The high side region 1915 is isolated from the substrate 302 and the low side region 1910 by N-sink layers 1925 on the sides and a DNW 678 below the p-resurf 675. Additional isolation may be provided through the optional NBL 668 below the DNW 678. The n-sinks 1925 and the NBL 668 are typically more heavily n-doped than the DNW 678. The p-sinks 1920 are typically more heavily p-doped than the p-resurf 675 or any other p-layer below the trenches. In implementations where the lower side region (or transistors) does not require isolation, the device pitch for the overall device 1900 can be improved using a structure as illustrated in FIG. 19.

Figures 20A, 20B:
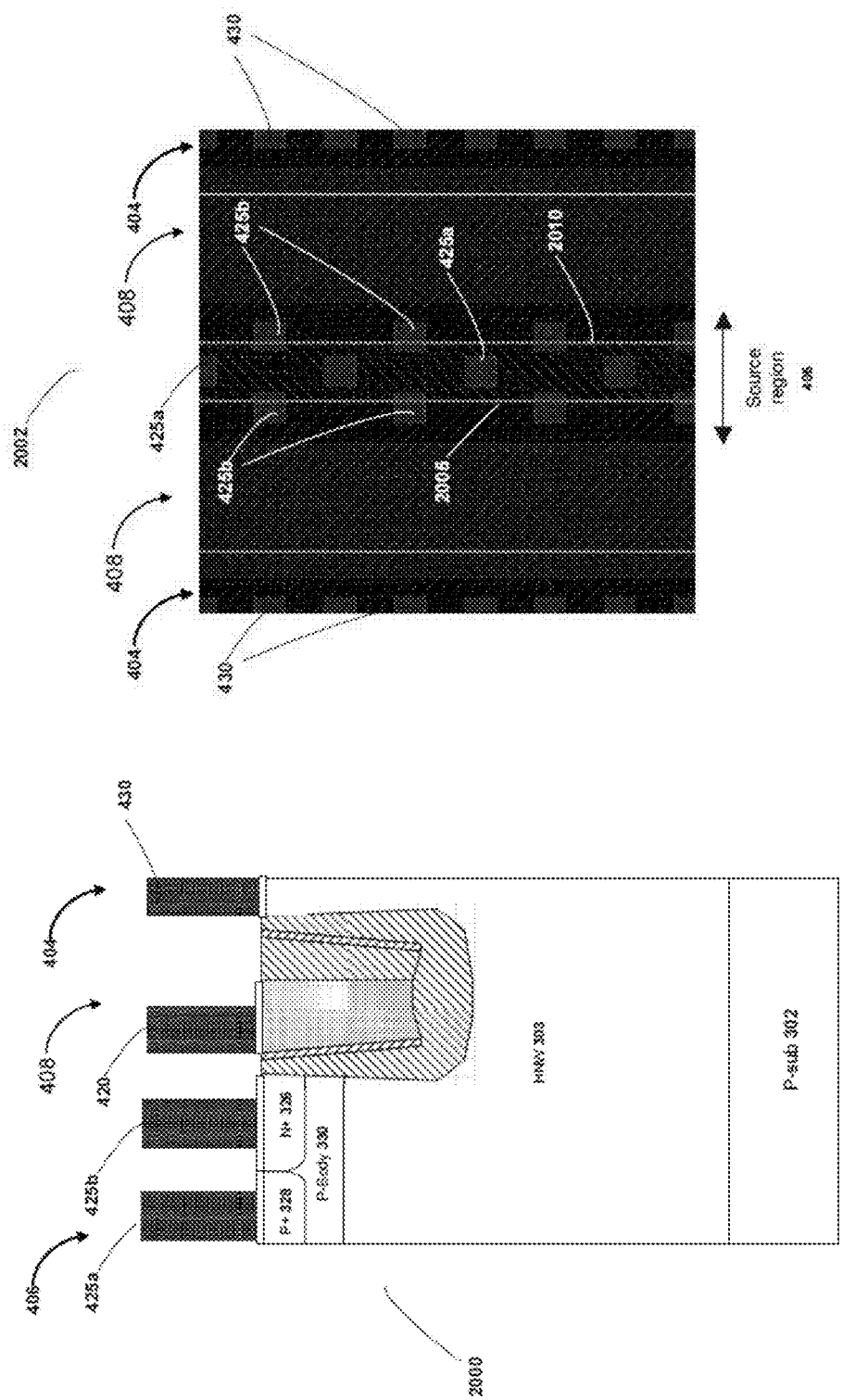
FIG. 20A is a schematic cross sectional view of a vertical gate LDMOS transistor.
FIG. 20B is a schematic top view of a device that includes an array of vertical gate LDMOS transistors.

FIG. 20A shows a schematic cross-sectional view of an example vertical LDMOS transistor 2000 and FIG. 20B shows a top view of an example device 2002 that uses the vertical LDMOS transistor. The transistor 2000 illustrated in FIG. 20A can be substantially similar to the transistor 400 depicted in FIG. 4. In some implementations, the transistor 2000 can be substantially similar to any of the transistors shown in FIGS. 6A-6E. In some implementations, the source region 406 of the transistor 2000 can have two separate source electrodes. 425a (referred to herein as the p+ source electrodes) and 425b (referred to herein as the n+ source electrodes) contacting the p+ region 328 and n+ region 326, respectively, rather than the single source electrode 425 depicted in FIG. 4. In some implementations, a single source electrode 425 can be useful in reducing cell pitch in low power switching applications. Referring to FIG. 20B, the device 2002 can include arrays of vertical LDMOS transistors where the n+ source electrodes 425b of different transistors from two adjacent arrays are aligned along two spaced apart lines 2005 and 2010 and the drain electrodes 430 are aligned with one another in the drain region 404 as shown as shown. The gate electrodes (not shown) are positioned in the gate region 408 between the source and drain regions of the arrays. FIG. 20B also shows the width of the source region of the device 2002.

Figure 21B:
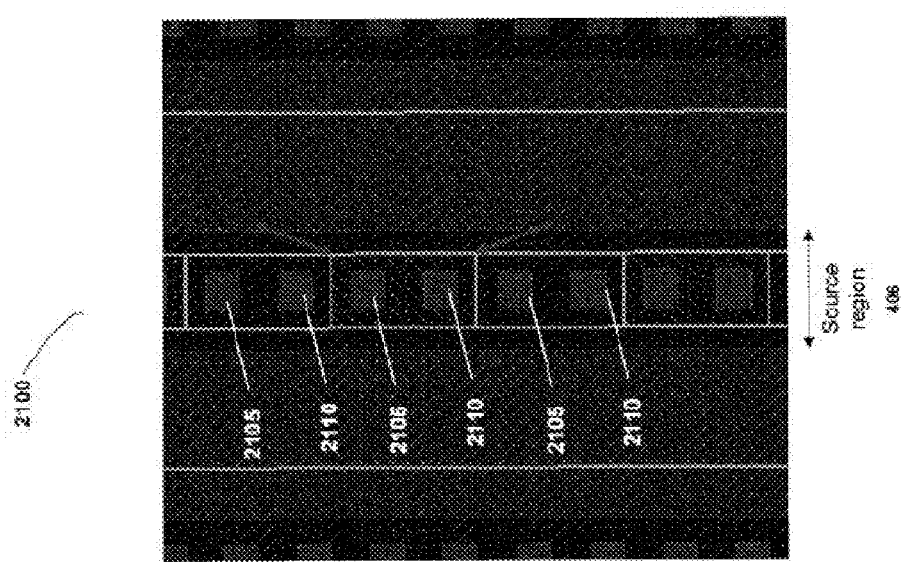
FIG. 21B is a schematic top view of a portion of a device that includes an array of vertical gate LDMOS transistors.
Figure 21A:
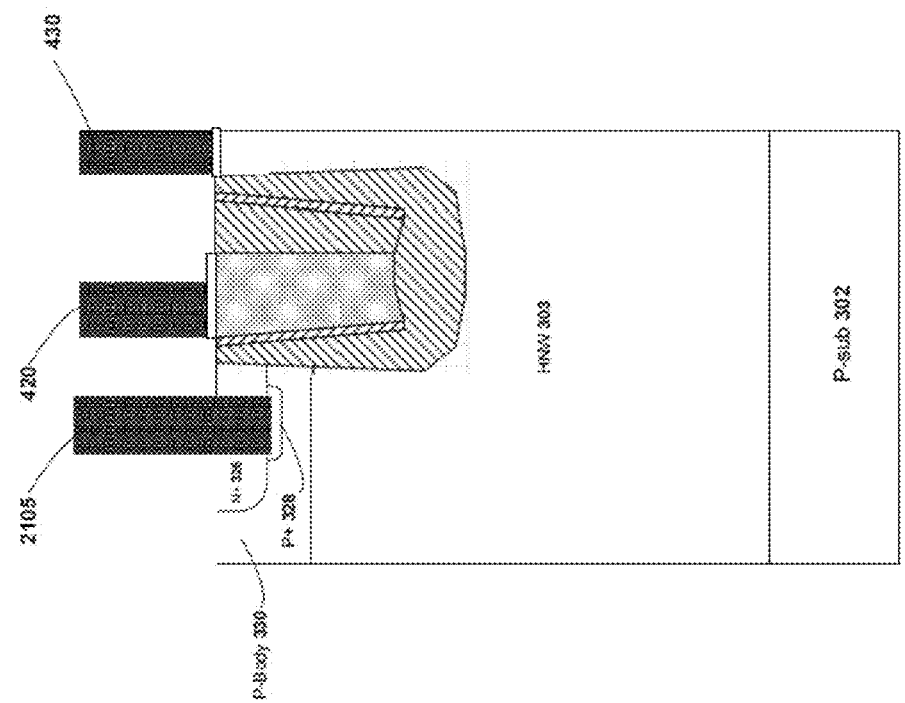
FIG. 21A is a schematic cross sectional view of a vertical gate LDMOS transistor.

In some implementations, the width of the source region can be reduced thereby further improving the cell pitch. FIG. 21A shows a schematic cross sectional view of an example implementation of a vertical LDMOS transistor where the width of the source region is reduced by positioning the p+ 328 below the n+ 326. This requires a p+ electrode 2105 to extend through the n+ layer to contact the p+ 328. FIG. 21B shows the top view for a device 2100 that uses the transistor shown in FIG. 21A. A separate n+ electrode 2110 can be provided for contacting the n+ 326 as shown in FIG. 21B. The p+ electrode 2105 and the n+ electrode 2110 can be aligned along a same line as shown in FIG. 21B. Therefore, in the device 2100, the n+ region 326 and the p+ region 328 are arranged one over another as parallel linear stripes parallel to an axis, and the corresponding electrodes 2110 and 2105 are spaced apart along the axis, e.g., in an alternating pattern. Positioning the p+ region 328 below the n+ 326 reduces the width of the source opening and consequently the cell pitch of the device. In some implementations, apart from the positioning of the p+ region 328 and the n+ region 326, the transistor depicted in FIG. 21A can be substantially similar to any of the transistors illustrated in FIG. 4, or FIG. 6A-6E.

The p+ 328 can be placed below the n+ 326 in non-vertical LDMOS transistors also. FIG. 22 illustrates an example where the p+ 328 is fabricated below the n+ 326 in a lateral transistor that is substantially similar to the transistor 300 depicted in FIG. 3. This can be used to reduce the cell pitch in devices that use such lateral LDMOS transistors.

A number of implementations have been described. Nevertheless, it will be understood that various modifications can be made without departing from the spirit and scope of the disclosure. For example, the n-well region (which can be fabricated by doping a p-type substrate) described in the above implementations can be replaced by an n-type material. In such cases, a vertical gate LDMOS transistor or device can be fabricated on an n-type substrate. Although a buck-converter is described, the vertical gate LDMOS transistor could be used in another type of converter (e.g., boost or buck-boost), or in a device other than a power converter. Other embodiments are within the scope of the following claims.

What is claimed is:

1. A transistor comprising:
an n-well region implanted into a surface of a substrate;
a trench in the n-well region, the trench having a first side and an opposing second side, the trench extending from the surface to a first depth, the trench comprising
a gate of conductive material in the trench, and
dielectric material filling a volume of the trench not filled by the conductive material;
a p-type material in a first region extending from a second depth to a third depth in the n-well region, wherein each of the second depth and the third depth is greater than the first depth;
a source region on the first side of the trench, the source region including a p-body region wherein an n+ region and a p+ region is implanted in the p-body region; and
a drain region on the second side of the trench, the drain region comprising an n+ region.

2. The transistor of claim 1 wherein a distance of the gate from the first side of the trench is less than a distance of the gate from the second side of the trench.

3. The transistor of claim 1 wherein a breakdown voltage of the transistor is substantially between a range 10V-100V.

4. The transistor of claim 1 wherein the conductive material is polysilicon.

5. The transistor of claim 1 wherein the dielectric material is an oxide.

6. The transistor of claim 1, wherein the first region is below the trench and a width of the first region is more than a width of the trench.

7. The transistor of claim 1, wherein the first region and the source region define a channel through which a current flows around the trench from the source region to the drain region.

8. The transistor of claim 1, wherein a concentration of the p-type material in the first region is lower than a concentration of the p-type material in the p-body region.

9. The transistor of claim 8, wherein the p-body region includes a deep p-body region and a shallow p-body region, the shallow p-body region being closer to the surface and having a higher concentration of the p-type material than the deep p-body region.

10. The transistor of claim 1, wherein the p-body region extends from the surface to the first region.

11. The transistor of claim 1 comprising a gate electrode in electrical contact with the gate of conductive material in the trench.

12. The transistor of claim 11 comprising a layer of silicide between the gate electrode and the gate of conductive material in the trench.

13. A transistor comprising:
an n-well region implanted into a surface of a substrate;
a trench in then-well region, the trench having a first side and an opposing second side, the trench extending from the surface to a first depth, the trench comprising
a gate of conductive material in the trench, and
dielectric material filling a volume of the trench not filled by the conductive material;
a source region on the first side of the trench, the source region including a p-body region wherein an n+ region and a p+ region is implanted in the p-body region;
a drain region on the second side of the trench, the drain region comprising an n+ region, the n+ region abutting the trench, and
a p-type material in a first region extending from a second depth to a third depth in the n-well region, wherein each of the second depth and the third depth is greater than the first depth.

14. A transistor comprising:
an n-well region implanted into a surface of a substrate;
a trench in then-well region, the trench having a first side and an opposing second side, the trench extending from the surface to a first depth, the trench comprising
a first dielectric material abutting the n-well on the first side and the opposing second side of the trench,
a source side dielectric liner on the first dielectric material on a source side of the trench,
a drain side dielectric liner on the first dielectric material on a drain side of the trench,
a gate of conductive material filling a first volume in the trench between the source side dielectric liner and the source side dielectric liner and abutting the source side dielectric liner, and
wherein the first dielectric material fills a second volume of the trench between the source side dielectric liner and the source side dielectric liner not filled by the conductive material;
a source region on the first side of the trench, the source region including a p-body region wherein an n+ region and a p+ region is implanted in the p-body region; and
a drain region on the second side of the trench, the drain region comprising an n+ region.

15. The transistor of claim 14, wherein the source-side dielectric liner and the drain side dielectric liner comprise silicon nitride.

16. The transistor of claim 14, wherein the first dielectric material comprises silicon oxide.

* * * * *

UNITED STATES PATENT AND TRADEMARK OFFICE
CERTIFICATE OF CORRECTION

PATENT NO. : 8,866,217 B2
APPLICATION NO. : 13/572015
DATED : October 21, 2014
INVENTOR(S) : Marco Zuniga et al.

It is certified that error appears in the above-identified patent and that said Letters Patent is hereby corrected as shown below:

In the Specification
Column 2, Line 4, "surface on the" should read --surface of the--.
Column 2, Line 7, "material in implanted" should read --material is implanted--.
Column 3, Line 35, "degree" should read --degrees--.
Column 3, Line 38, "degree" should read --degrees--.
Column 3, Line 45, "pattering" should read --patterning--.
Column 9, Line 19, "T'$_{width}$" should read --T$_{width}$--.
Column 10, Line 28, "devices" should read --device--.
Column 15, Line 32, "over rest" should read --over the rest--.
Column 16, Line 30, "pattering" should read --patterning--.
Column 16, Line 47, "p-body can 932" should read --p-body 932--.
Column 17, Line 6, "pattering" should read --patterning--.
Column 17, Line 34, "and the have" should read --and have--.
Column 17, Line 43, "pattering" should read --patterning--.
Column 17, Line 52, "pattering" should read --patterning--.
Column 18, Line 54, "pattering" should read --patterning--.
Column 20, Line 42, "similarly" should read --similar--.
Column 20, Line 45, "implementation" should read --implementations--.
Column 22, Line 16, "similarly to as" should read --similarly as--.
Column 22, Line 30, "similarly to as" should read --similarly as--.
Column 22, Line 64, "used, As" should read --used. As--.
Column 23, Line 13, "14I-14I" should read --14I-14J--.

In the Claims
Column 24, Lines 65 to 66, "substantially same" should read --substantially the same--.
Column 26, Line 5, "as shown as shown." should read --as shown.--.
Column 26, Line 53, "then-well" should read --the n-well--.
Column 26, Line 60, "then-well" should read --the n-well--.

Signed and Sealed this
Twelfth Day of May, 2015

Michelle K. Lee
*Director of the United States Patent and Trademark Office*

Column 27, Line 34, "then-well" should read --the n-well--.
Column 28, Line 13, "then-well" should read --the n-well--.